(12) United States Patent
Kamikubo et al.

(10) Patent No.: US 7,679,068 B2
(45) Date of Patent: Mar. 16, 2010

(54) METHOD OF CALCULATING DEFLECTION ABERRATION CORRECTING VOLTAGE AND CHARGED PARTICLE BEAM WRITING METHOD

(75) Inventors: Takashi Kamikubo, Kanagawa (JP); Shuichi Tamamushi, Kanagawa (JP); Hitoshi Sunaoshi, Kanagawa (JP); Kenji Ohtoshi, Kanagawa (JP); Rieko Nishimura, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 272 days.

(21) Appl. No.: 11/617,165

(22) Filed: Dec. 28, 2006

(65) Prior Publication Data
US 2007/0158576 A1 Jul. 12, 2007

(30) Foreign Application Priority Data
Jan. 11, 2006 (JP) .............................. 2006-003762

(51) Int. Cl.
*G21K 5/10* (2006.01)
*G01D 5/00* (2006.01)
(52) U.S. Cl. ................. 250/400; 250/396 R; 250/492.1
(58) Field of Classification Search .......... 250/396 R, 250/397, 398, 400, 492.3, 453.1, 492.2, 492.22, 250/492.21, 492.23, 306, 307, 310, 311, 250/496 R, 491.1; 430/296, 297, 298, 299, 430/30, 942
See application file for complete search history.

(56) References Cited
U.S. PATENT DOCUMENTS 4,825,033 A * 4/1989 Beasley ................. 219/121.25
5,086,015 A * 2/1992 Itoh et al. .............. 204/192.34
5,675,253 A * 10/1997 Smith et al. ................. 324/306
6,407,398 B1 * 6/2002 Kurokawa et al. ..... 250/492.22
2003/0155509 A1 * 8/2003 Nakasuji et al. ............. 250/310
2005/0277035 A1 * 12/2005 Yamamoto ................... 430/30

(Continued)

FOREIGN PATENT DOCUMENTS
JP      2002-216690         8/2002

OTHER PUBLICATIONS

G. Owen, "Automatic Measurement and Correction of Deflection Astigmatism and Defocusing in the Hewlett-Packard 605 Electron Beam Lithography System", Journal of Vacuum Science Technology, 19(4), Nov./Dec. 1981.*

(Continued)

*Primary Examiner*—Jack I Berman
*Assistant Examiner*—Nicole Ippolito Rausch
(74) *Attorney, Agent, or Firm*—Oblon, Spivak, McClelland, Maier & Neustadt, L.L.P.

(57) ABSTRACT

A method of obtaining a deflection aberration correcting voltage. The method includes writing predetermined patterns at a plurality of focus height positions such that a dose is used as a variable. Dimensional variations of width sizes of the predetermined patterns written at the plurality of focus height positions such that the dose is used as the variable are measured. Further, effective resolutions of the written predetermined patterns are calculated by using the dimensional variations. The method further includes, on the basis of a focus height position at which a minimum effective resolution of the predetermined patterns is obtained, calculating a correcting voltage to correct deflection aberration and outputting the correcting voltage. The correcting voltage is used when a charged particle beam is deflected.

14 Claims, 22 Drawing Sheets

U.S. PATENT DOCUMENTS

2006/0060781 A1* 3/2006 Watanabe et al. ............ 250/310
2007/0284538 A1* 12/2007 Zani et al. ................... 250/398

OTHER PUBLICATIONS

T. Takigawa, et al., "Advanced E-Beam Lithography", Journal of Vacuum Science and Technology B, 9(8), Nov./Dec. 1991.*

G. Owen "Automatic Measurement and Correction of Deflection Astigmatism and Defocusing in the Hewlett-Packard 605 Electron Beam Lithography System", Journal of Vacuum Science Technology, 19(4), Nov./Dec. 1981.*

T. Takigawa et al., "Advanced E-Beam Lithography", Journal of Vacuum Science and Technology B, 9(8), Nov./Dec. 1991.*

T. Watanabe et al., "Pattern Width Evaluation Method for Electron-Beam Pattern Data", Journal of Vacuum Science and Technology B, 12(6), Nov./Dec. 1995, pp. 2637-2641.*

* cited by examiner $$-\frac{1}{2}\left\{Z(\sigma_{xmin}) + Z(\sigma_{ymin})\right\} \to 0$$

$$V_\alpha = -\frac{c_1}{k_1}$$

$$\left\{Z(\sigma_{xmin}) - Z(\sigma_{ymin})\right\} \to 0$$

$$V_\beta = -\frac{c_2}{k_2}$$

METHOD OF CALCULATING DEFLECTION ABERRATION CORRECTING VOLTAGE AND CHARGED PARTICLE BEAM WRITING METHOD

CROSS-REFERENCE TO RELATED APPLICATION

This application is based upon and claims the benefit of priority from the prior Japanese Patent Application No. 2006-003762 filed on Jan. 11, 2006 in Japan, the entire contents of which are incorporated herein by reference.

BACKGROUND OF THE INVENTION

1. Field of the Invention

The present invention relates to a method of calculating a deflection aberration correcting voltage and a charged particle beam writing method. For example, the present invention relates to an electron beam writing method which irradiates an electron beam on a target object while variably shaping the electron beam and a method of acquiring a correcting voltage which corrects deflection aberration generated in pattern writing.

2. Related Art

A lithography technique which leads development of micropatterning of a semiconductor device is a very important process which uniquely generates a pattern in semiconductor manufacturing processes. In recent years, with an increase in integration density of an LSI, the circuit line width required for semiconductor devices progressively decreases year after year. In order to form a desired circuit pattern on the semiconductor devices, a high-definition original pattern (also called a reticle or a mask) is necessary. In this case, an electron beam writing technique has an essentially excellent resolution and is used in production of a high-definition original pattern.

FIG. 23 is a conceptual diagram for explaining an operation of a conventional variable-shaped electron beam photolithography apparatus.

A variable-shaped electron writing apparatus (electron beam (EB) writing apparatus) operates as follows. A square, for example, rectangular opening 411 to shape an electron beam 330 is formed in a first aperture 410. In a second aperture 420, a variable-shaped opening 421 to shape the electron beam 330 having passed through the opening 411 in a desired square shape is formed. The electron beam 330 irradiated from a charged particle source 430 and having passed through the opening 411 is deflected by a deflector. The electron beam 330 passes through a part of the variable-shaped opening 421 and is irradiated on a target object 340 placed on a stage. The stage continuously moves in one predetermined direction (for example, defined as an X direction) while writing a pattern. More specifically, a square shape which can pass through both the opening 411 and the variable-shaped opening 421 is written in a writing region of the target object 340 placed on the stage. A scheme which causes an electron beam to pass through both the opening 411 and the variable-shaped opening 421 to form an arbitrary shape is called a variable shaped scheme.

When a predetermined pattern is written on the target object 340, deflection aberration such as deflection astigmatism or field curvature may occur. Development of a technique of correcting the deflection aberration is tried.

As a technique related to deflection aberration, the following technique is disclosed in order to correct optical aberration blur or an electron beam shape size error caused by deflection. That is, voltages applied to electrodes are controlled depending on conditions of a deflected charged beam by use of a rotational symmetry round electron lens capable of independently controlling a control voltage. In this manner, it is assumed that the charged beam is controlled (for example, see Published Unexamined Japanese Patent Application No. 2002-216690 (JP-A-2002-216690)).

As described above, in the writing apparatus, deflection aberration such as deflection astigmatizm or field curvature occurs when a predetermined pattern is written on a target object such as a mask. With an increase in integration density of an LSI in recent years, a circuit line width required for semiconductor devices progressively decreases year after year. For this reason, when dimensional accuracy becomes strict, the deflection aberration becomes dominant as a factor on which dimensional accuracy depends. However, the conventional techniques do not establish a method of exactly inspecting a residual error to check whether a correcting voltage used in correction of the deflection aberration by a deflector or the like is appropriate.

BRIEF SUMMARY OF THE INVENTION

Therefore, the present invention has as its object to facilitate check of a correction residual error of deflection aberration and provide a method of calculating a correcting voltage for more appropriate deflection aberration and a writing method.

In accordance with one aspect of this invention, a method of calculating a deflection aberration correcting voltage is provided. The method includes writing predetermined patterns at a plurality of focus height positions measuring dimensional variations of width sizes of the predetermined patterns written at the plurality of focus height positions. Effective resolutions of the written predetermined patterns are calculated by using the dimensional variations. Further, the method includes, on the basis of a focus height position at which a minimum effective resolution of the predetermined patterns is obtained, calculating a correcting voltage to correct deflection aberration and outputting the correcting voltage, wherein the correcting voltage is used when a charged particle beam is deflected.

In accordance with another aspect of the invention, a charged particle beam writing method includes writing predetermined patterns at a plurality of focus height positions. On the basis of a focus height position at which a minimum effective resolution of the written predetermined patterns is obtained, a correcting voltage to correct deflection aberration when a charged particle beam is deflected is calculated. Further, the method includes, by using the correcting voltage, deflecting the charged particle beam to write a desired pattern on a target object.

BRIEF DESCRIPTION OF THE DRAWINGS

FIGS. 10A and 10B are diagram showing focal positions in deflection states;

DETAILED DESCRIPTION OF THE INVENTION

In the following embodiments, a configuration using an electron beam will be described as an example of a charged particle beam. The charged particle beam is not limited to an electron beam. A beam such as an ion beam using charged particles may be used.

FIRST EMBODIMENT

Figure 1:
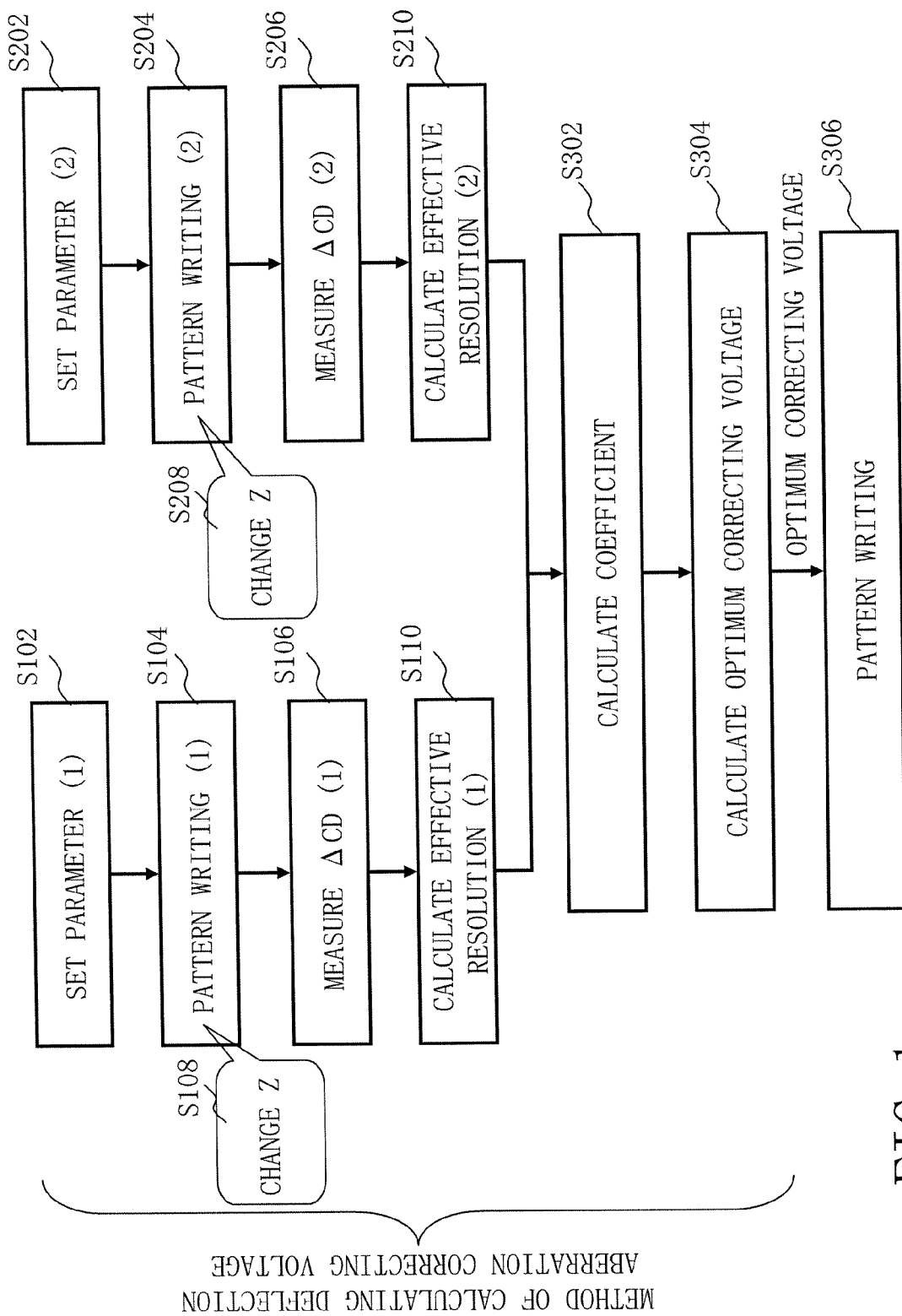
FIG. 1 is a flow chart showing main steps of an electron beam writing method according to a first embodiment.

FIG. 1 is a flow chart showing main steps of an electron beam writing method according to a first embodiment.

In FIG. 1, a method of calculating a deflection aberration correcting voltage executes a series of steps, i.e., a parameter setting (1) step (S102), a pattern writing step (1) (S104), a ΔCD measuring step (1) (S106), a z changing step (S108), an effective resolution calculating step (1) (S110), a parameter setting (2) step (S202), a pattern writing step (2) (S204), a ΔCD measuring step (2) (S206), a z changing step (S208), an effective resolution calculating step (2) (S210), a coefficient calculating step (S302), and an optimum correcting voltage calculation step (S304). The electron beam writing method executes the steps of the method of calculating a deflection aberration correcting voltage and a series of steps called a pattern writing step (S306).

Figure 2:
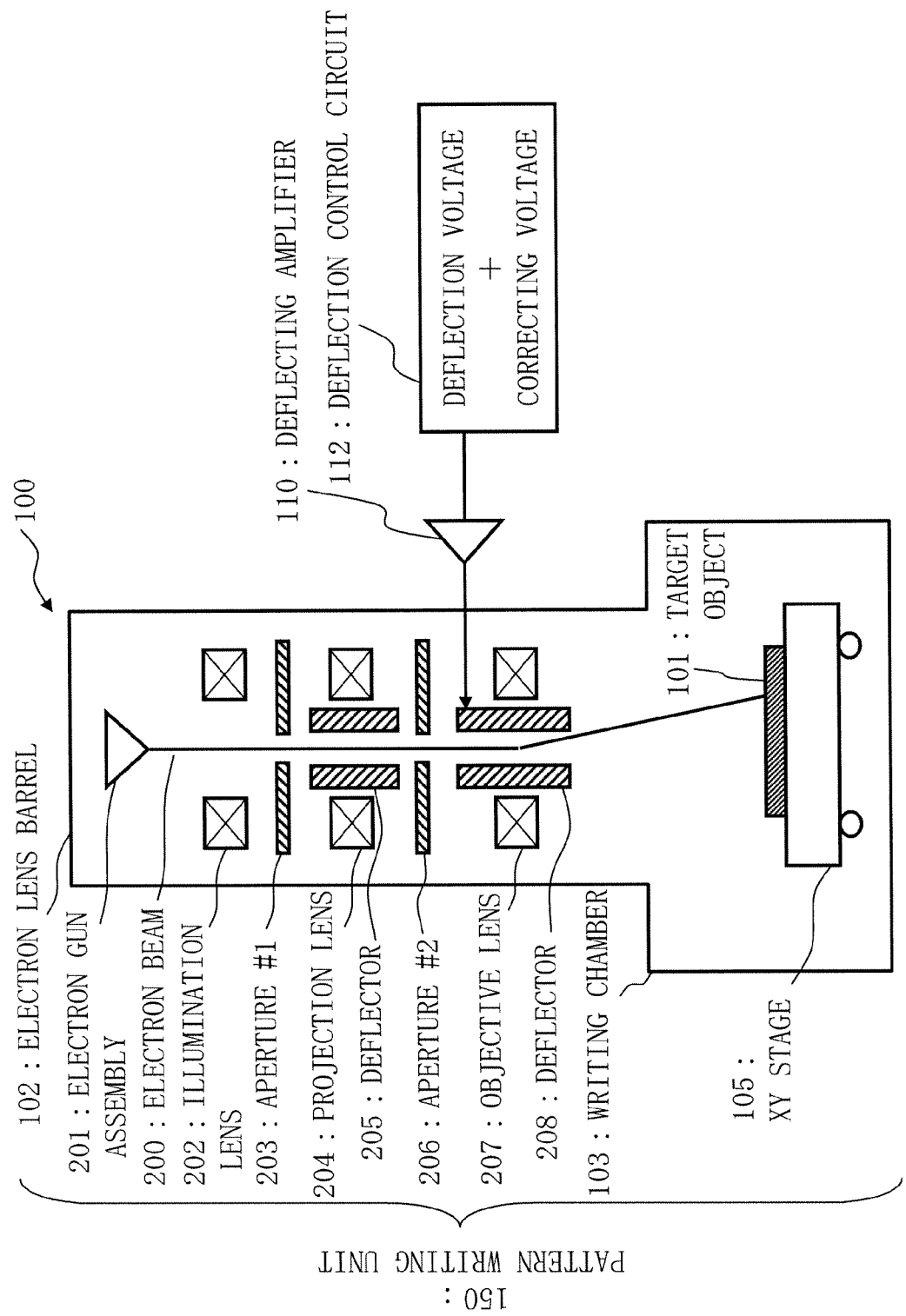
FIG. 2 is a conceptual diagram showing a configuration of a writing apparatus according to the first embodiment.

FIG. 2 is a conceptual diagram showing a configuration of a writing apparatus according to the first embodiment.

In FIG. 2, a writing apparatus 100 serving as an example of a charged particle writing apparatus includes a pattern writing unit 150 and a control system. The writing apparatus 100 writes or "draws" a pattern onto a target object 101. The target 101 object includes a mask. The PATTERN writing unit 150 includes an electron lens barrel 102 and a writing chamber 103. Arranged in the electron lens barrel 102 are an electron gun 201, an illumination lens 202, a first aperture 203, a projection lens 204, a deflector 205, a second aperture 206, an objective lens 207, and a deflector 208. In the writing chamber 103, an XY stage 105 is arranged. A target object 101 is placed on the XY stage 105. As the control system, a deflection control circuit 112 serving as an example of a deflection control unit and a deflecting amplifier 110 are included. In FIG. 1, constituent parts required to explain the first embodiment are described. The writing apparatus 100 may include other configurations.

An electron beam 200 emitted from the electron gun 201 entirely illuminates a first aperture 203 having a square, for example, rectangular opening through the illumination lens 202. The electron beam 200 serves as an example of a charged particle beam. First, the electron beam 200 is shaped in a rectangular shape. The electron beam 200 of a first aperture image having passed through the first aperture 203 is projected on the second aperture 206 by the projection lens 204. A position of the first aperture image on the second aperture 206 is controlled in deflection by the deflector 205. Consequently, the beam shape and the beam size can be changed. The electron beam 200 of the second aperture image having passed through the second aperture 206 is focused by the objective lens 207. The electron beam 200 is deflected by the deflector 208 of, for example, an electrostatic type controlled by the deflection control circuit 112 and is irradiated on a desired position of the target object 101. The XY stage 105 is movably arranged. A pattern is written on the target object 101 while moving the XY stage 105. In this case, in the deflection control circuit 112, a signal is output to the deflecting amplifier 110 such that a voltage to which a correcting voltage, in addition to an essential deflection voltage, is added is applied to the deflector 208. The essential deflection voltage deflects the electron beam 200 by an essential amount of deflection. The correcting voltage corrects deflection aberration such as field curvature or astigmatism.

Figure 3:
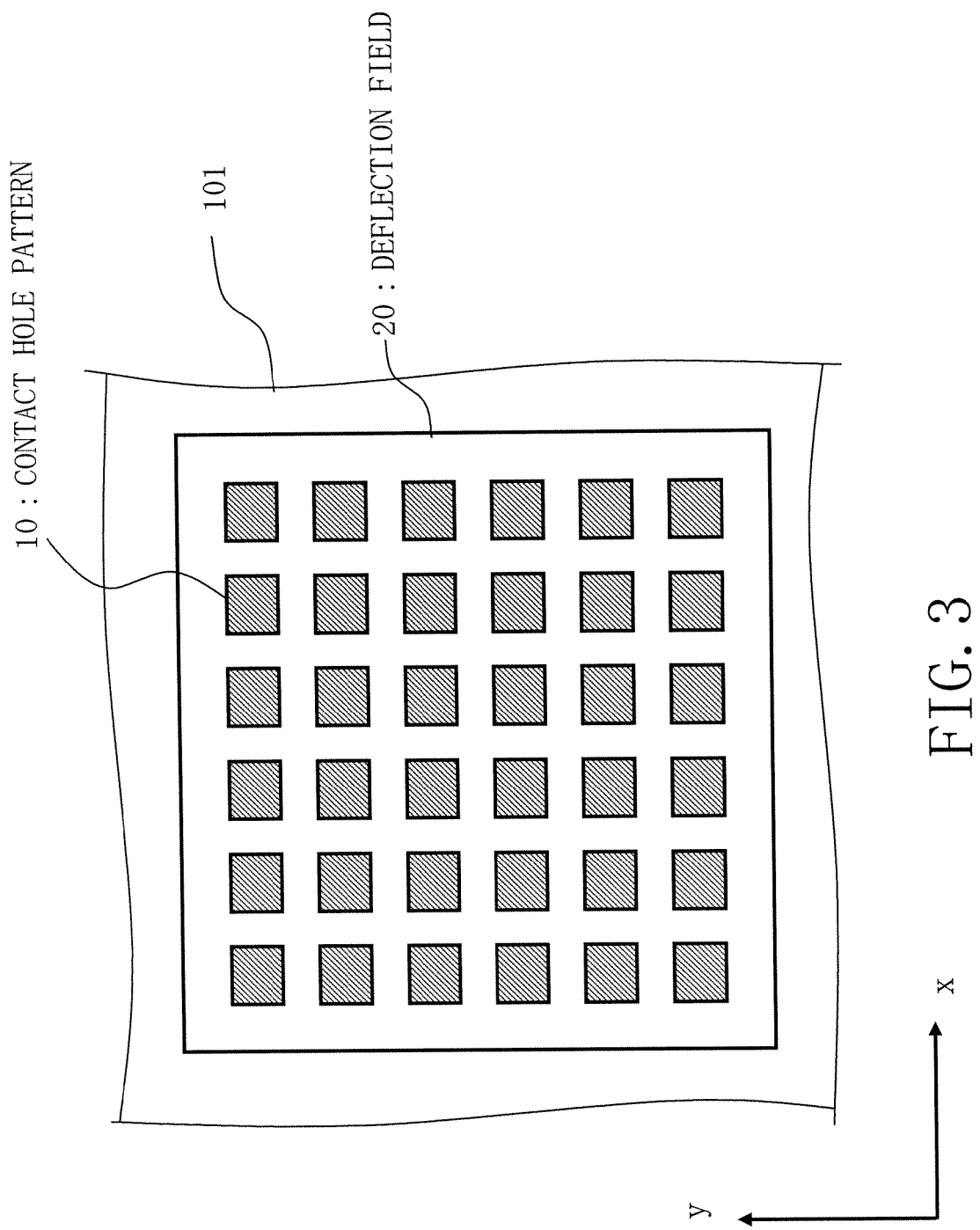
FIG. 3 is a diagram showing an example of an evaluating pattern according to the first embodiment.

FIG. 3 is a diagram showing an example of an evaluating pattern according to the first embodiment.

In FIG. 3, as an evaluating pattern, a contact hole pattern 10 (an example of a predetermined pattern) is formed in a deflection field 20 on the target object 101. The contact hole pattern 10 is a pattern having the widths in an x direction and a y direction. The contact hole pattern 10 is used to make it possible to measure pattern width sizes (CD) in the x direction and the y direction.

Figure 4:
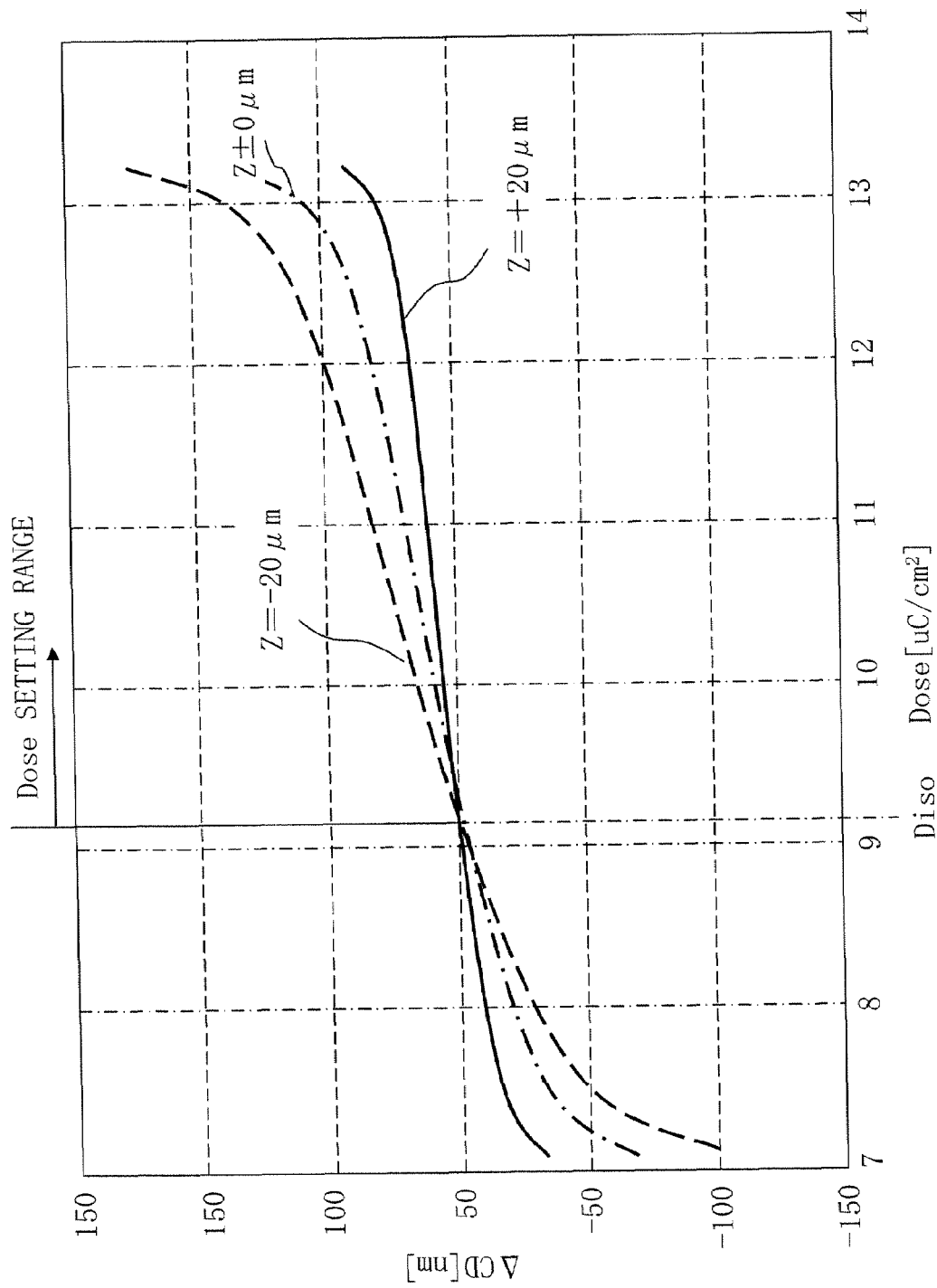
FIG. 4 is a graph showing a relationship between a dimensional variation and a dose.

FIG. 4 is a graph showing a relationship between a dimensional variation and a dose.

Prior to a step of calculating an optimum correcting voltage, a change in dimensional variation (ΔCD) of a pattern width when writing is performed at a plurality of focus height positions (z values) such that a dose is used as a variable is measured. In the method of calculating a deflection aberration correcting voltage in the first embodiment, a focus height position (z value) is vibrated as will be described later to measure deflection ΔCD in respective cases. An optimum deflection aberration correcting voltage is calculated by using the ΔCD of the respective cases. By way of example, a relationship between a dimensional variation and a dose under the following conditions is obtained in FIG. 4. More specifically, the conditions are given by a focus height position z=±0 serving as a theoretical best focus value, a focus height position z=+20 μm serving as a position heightened from the best focus value by 20 μm, and a focus height position z=−20 μm serving as a position lowered from the best focus value by 20 μm.

In this case, depending on a dose, there exists an iso focal dose (Diso) having a constant value without changing ΔCD even though the focus height position (z value) is vibrated. Therefore, the graph shown in FIG. 4 is obtained to acquire or calculate the value of Diso. A method of calculating a deflection aberration correcting voltage (will be described later) is preferably executed by a dose of a value larger than the value of Diso. It is possible to use a dose except Diso although the value larger than the value of Diso is preferable. More specifically, the focus height position (z value) is vibrated to calculate an optimum deflection aberration correcting voltage by using the dose in a range in which ΔCD changes. Steps of method of calculating a deflection aberration correcting voltage will described below.

In step S102, as a parameter setting (1) step, respective parameters are set when the evaluating pattern shown in FIG. 3 is written on the target object 101 by the writing apparatus. In this case, for example, a dose falling within the dose setting range shown in FIG. 4 is used. The evaluating pattern writes at the exposure dose instead of the iso focal dose. A correcting voltage $V_{10}$ to correct field curvature which is predicted to some extent and a correcting voltage $V_{20}$ to correct astigmatism are set. As a consequence, in addition to an essential deflection voltage V, $V_{10}+V_{20}$ is added to the deflector 208 as a correcting voltage.

In S104, as a pattern writing step (1), the electron beam 200 is deflected by the deflector 208 using a first predetermined correcting voltage. At a deflected position, contact hole patterns shown in FIG. 3 are formed at a plurality of focus height positions z (focal positions). The pattern writing step (1) serves as an example of a first pattern writing step. $V_{10}$ and $V_{20}$ are used as the first predetermined correcting voltage here. The focus height position can be controlled by the objective lens 207. The focus height position is preferably vibrated in the range of, for example, ±20 μm from the best focus position (z=±0). For example, all the contact hole patterns 10 at the focus positions are written while changing the focus height position, for example, every 2.5 μm. In this case, all the contact hole patterns 10 are written in accordance with a focus height position (z=−20 μm) −20 μm distant from the best focus position (z=±0).

In S106, as a ΔCD measuring step (1) serving as an example of a first size variation measuring step, a dimensional variation ΔCD of a width size CD of the contact hole patterns 10 written at the plurality of focus height positions is measured by using the first predetermined correcting voltage. The dimensional variation ΔCD serves as an example of the first dimensional variation. As the first predetermined correcting voltage, the $V_{10}$ and $V_{20}$ are used. The dimensional variation ΔCD may be calculated by subtracting the measured CD from a reference value $CD_0$ of a pattern width size serving as a reference. In addition, the contact hole pattern 10 is used, respective CDs in the x direction and the y direction are measured to calculate ΔCDs in the x direction and the y direction. The ΔCDs in the x direction and the y direction are calculated with respect to all the contact hole patterns 10.

In S108, as a z changing step, setting of a focus height position is changed to cause the flow to return to S104. For example, a focus height position (z=−17.5 μm) obtained by changing a set focus height position (z=−20 μm) by 2.5 μm. The above pattern writing step (1) and the ΔCD measuring step (1) are performed. These steps are repeated, so that the best focus position (z=±0) is vibrated in the range of, for example, ±20 μm to measure the ΔCDs in the x direction and the y direction of all the contact hole patterns 10 at the respective focus height positions z.

In S110, as an effective resolution calculating step (1), effective resolutions or "effective blurs" $\sigma_{blur}$ of the written contact hole patterns 10 are calculated by using the size variations ΔCDs in the x direction and the y direction. The effective resolution calculating step (1) is an example of a first effective resolution calculating step. The effective resolution $\sigma_{blur}$ calculated here is an example of the first effective resolution.

Figure 5:
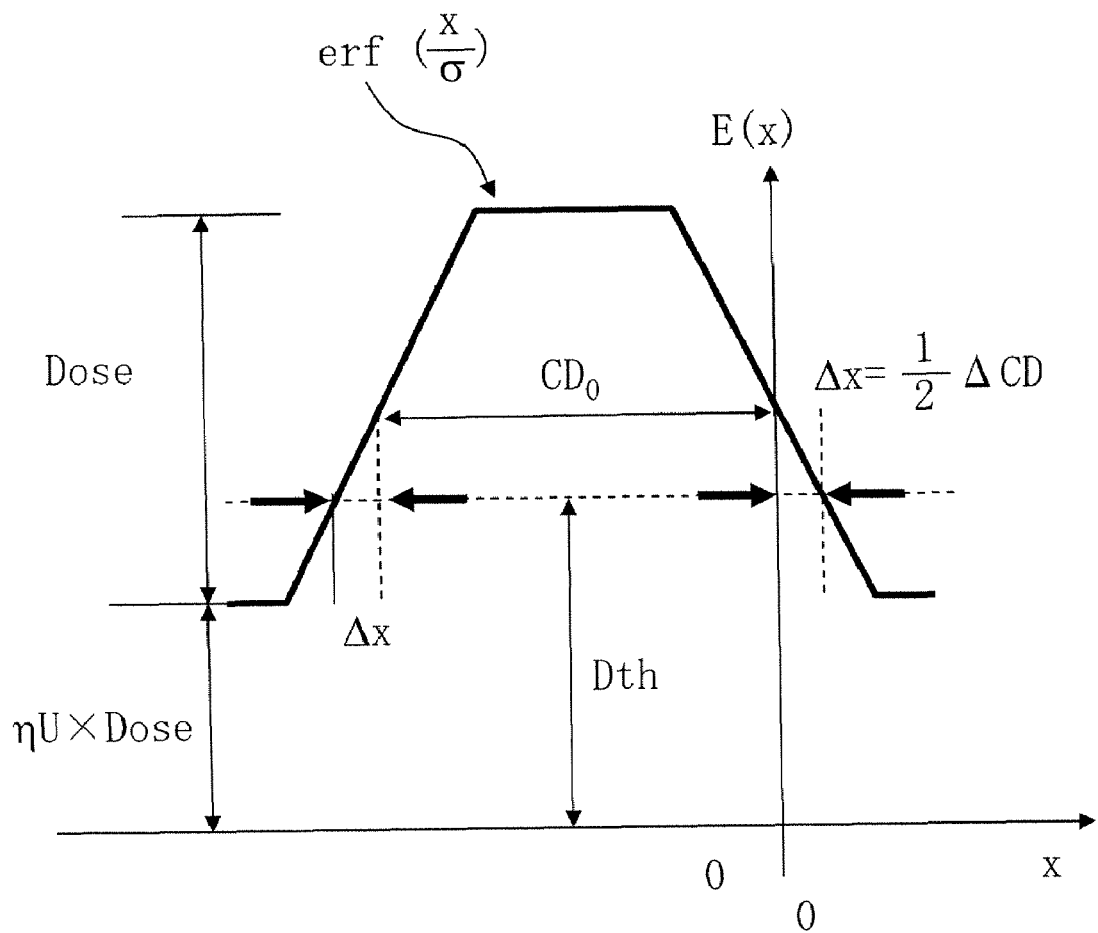
FIG. 5 is a diagram showing an example of a pattern profile in a Threshold model.

FIG. 5 is a diagram showing an example of a pattern profile in a Threshold model.

A dimensional variation is given by ΔCD. A threshold dose is given by Dth. A dose is given by Dose. A ratio (proximity effect parameter) of back scattering electrons to forward scattering electrons is given by η. A pattern density is given by U. An in-resist accumulated energy is given by E(x). A reference value of a pattern width size is given by $CD_0$. In this case, a pattern profile in a Threshold model in which a line width obtained by cutting an energy profile accumulated in a resist at a certain level (threshold value) is used as a line width obtained after process processing can be shown in FIG. 5. In FIG. 5, Δx indicates a half of ΔCD. In FIG. 5, the threshold dose (Dth) is deviated from the iso-focal dose (Diso). For this reason, Δx, consequently, ΔCD is present. In this case, only the x direction is described for simple explanation. However, a pattern profile can be similarly structured in the y direction. The effective resolution $\sigma_{blur}$ of the pattern profile in the Threshold model can be expressed by the following equation (1).

$$\sigma_{blur} = \frac{\Delta CD}{2 \cdot erf^{-1}\left\{1 + 2\eta \cdot U - 2(1+\eta)\frac{Dth}{Dose}\right\}} \quad (1)$$

With respect to the contact hole patterns 10, by use of the measured dimensional variations ΔCDs in the x direction and the y direction, the effective resolution $\sigma_x$ in the x direction and the effective resolution $\sigma_y$ in the y direction can be calculated as the effective resolution $\sigma_{blur}$ according to equation (1). In Equation (1), the proximity effect parameter η may be separately calculated by an experiment in advance. A pattern density of the contact hole patterns 10 is preferably used as the pattern density U. A dose at which the theoretically desired line width CD is obtained is preferably used as the threshold dose Dth.

Figure 6:
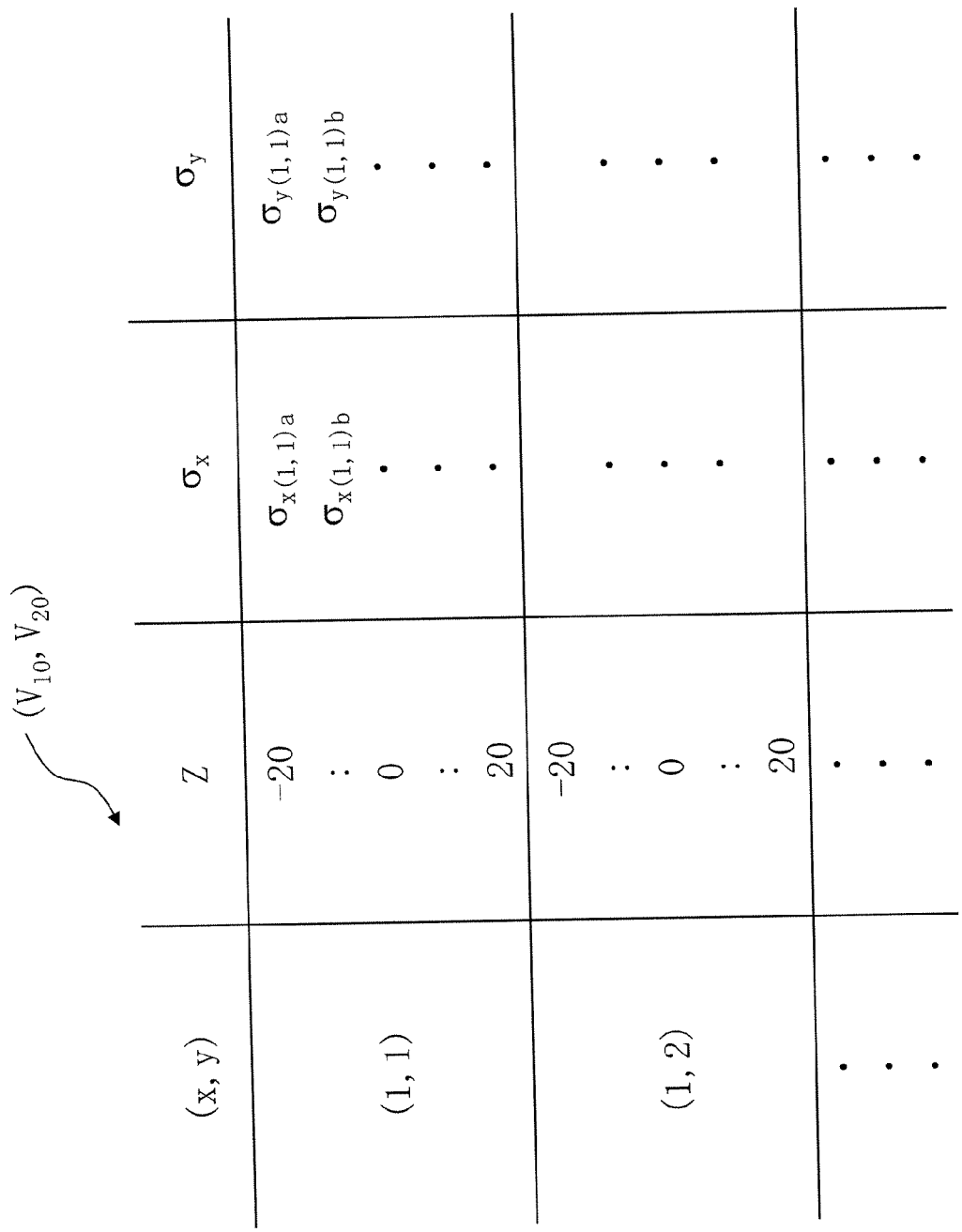
FIG. 6 is a diagram showing an example of a table showing some parameters and an effective resolution in the first embodiment.

FIG. 6 is a diagram showing an example of a table showing some parameters and an effective resolution in the first embodiment.

In FIG. 6, the contact hole patterns 10 are shown as coordinates (x, y) in the x direction and the y direction. At each coordinates, the focus height position z is vibrated to show the effective resolution $\sigma_x$ in the x direction and the effective resolution $\sigma_y$ in the y direction in each case. Other writing conditions (fixed values) are omitted here.

This table is obtained to make it possible to check a state in which the minimum focus height positions z ($\sigma_{xmin}$) of the minimum effective resolutions $\sigma_{xmin}$ in the x direction are not zero at all the positions in a deflection field. Similarly, it is possible to check a state in which the focus height positions z ($\sigma_{ymin}$) of the effective resolutions $\sigma_{ymin}$ in the y direction are not zero. That is, it is possible to check the state in which the focus height position z ($\sigma_{xmin}$) of the effective resolution $\sigma_{xmin}$ in the x direction and the focus height position z ($\sigma_{ymin}$) of the effective resolution $\sigma_{ymin}$ in the y direction are not zero. More specifically, it can be checked whether or not a correction residual error ($\Delta z$) is present. Since the focus height position z is vibrated, it is possible to know a manner of changes in effective resolution with respect to changes of the focus height positions z at the imaginary correcting voltage $V_{10}$ and the imaginary correcting voltage $V_{20}$. According to the information obtained from the table, an optimum value to be set of the correcting voltage can be predicted to some extent.

Figure 7:
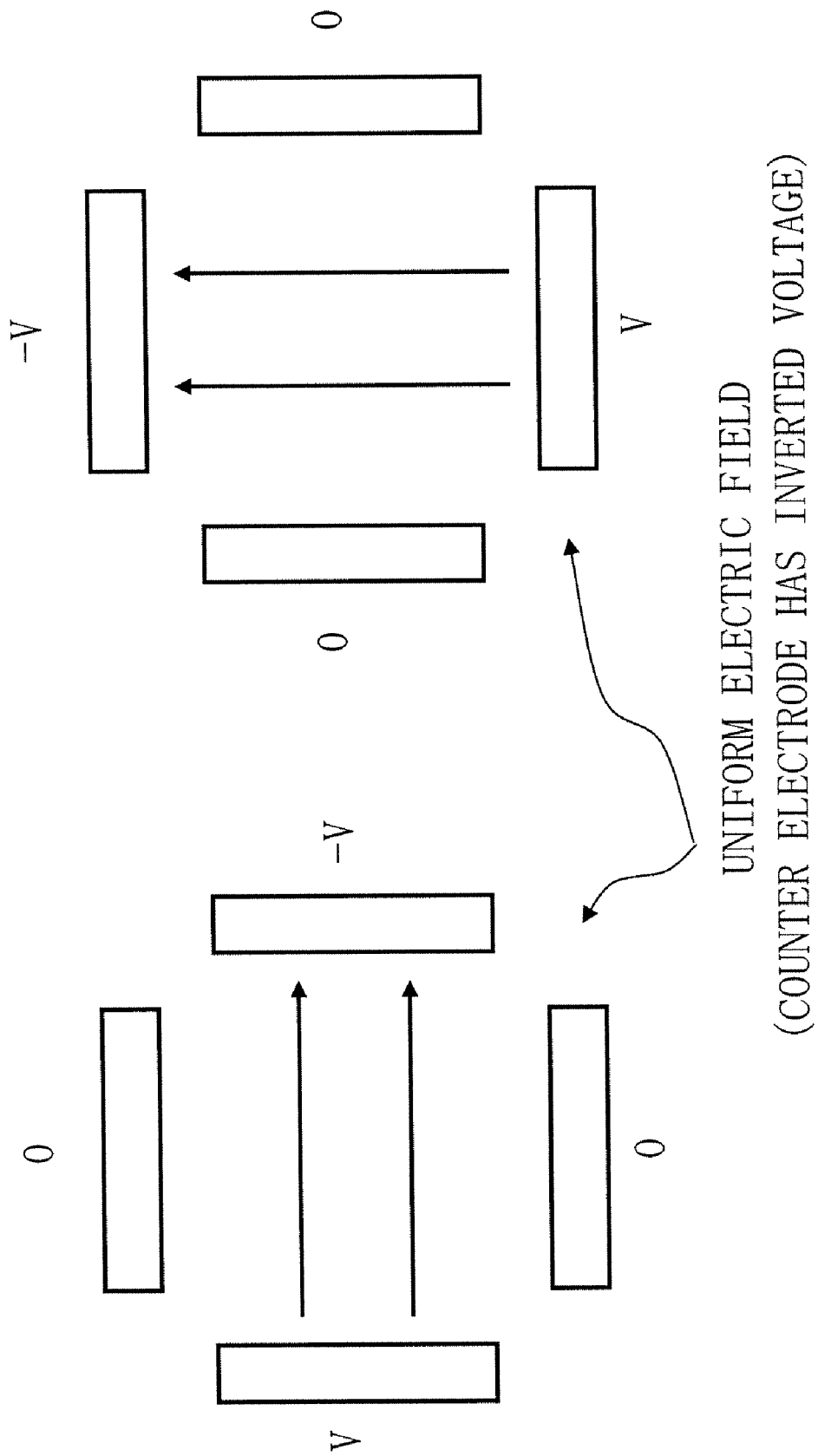
FIG. 7 is a diagram for explaining a way of applying a voltage to a deflector when a uniform electric field is obtained.

FIG. 7 is a diagram for explaining a way of applying a voltage to a deflector when a uniform electric field is obtained in the first embodiment.

Figure 8:
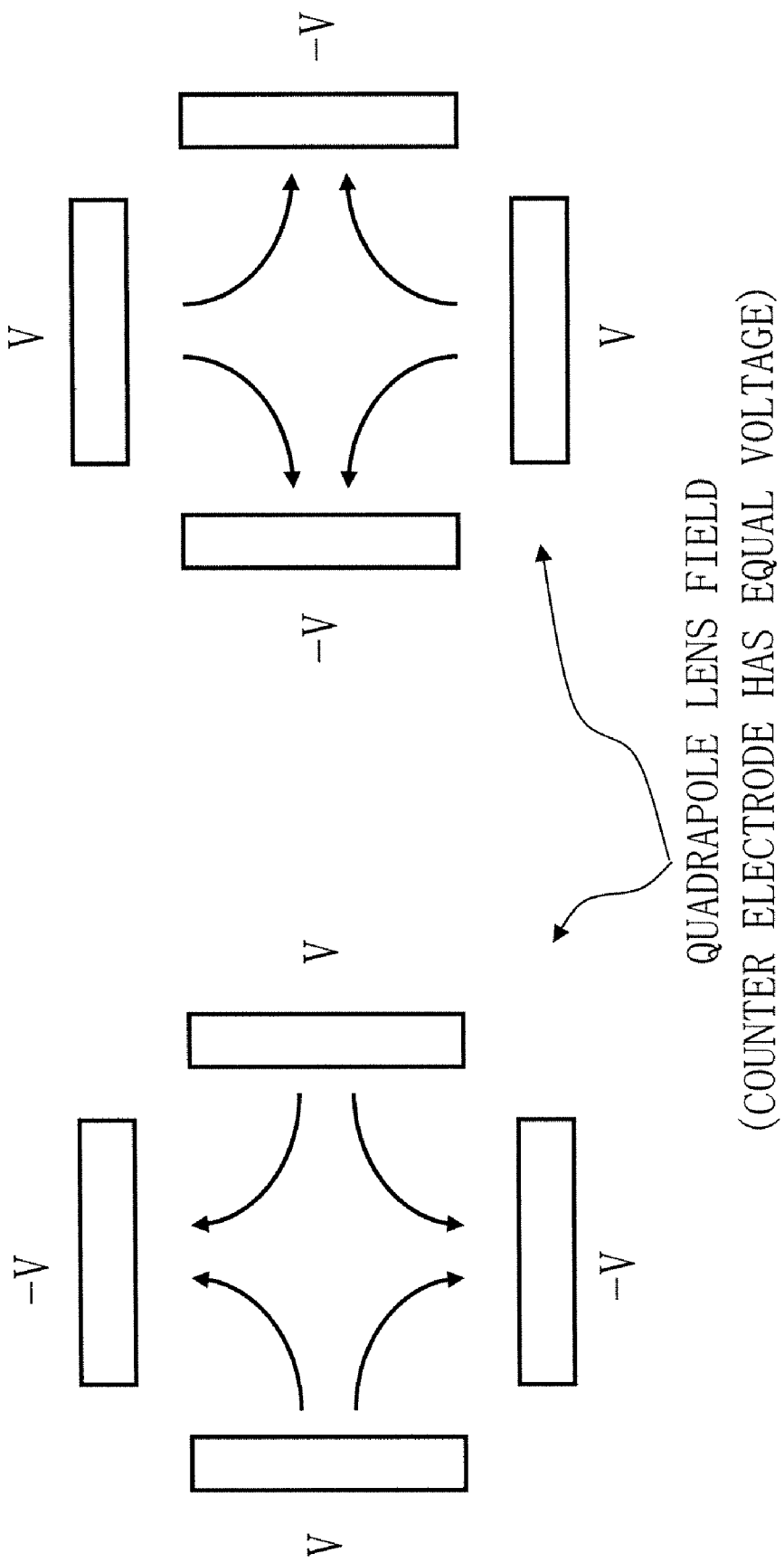
FIG. 8 is a diagram for explaining a way of applying a voltage to a deflector when a quadrapole lens field is obtained.

FIG. 8 is a diagram for explaining a way of applying a voltage to a deflector when a quadrapole lens field is obtained in the first embodiment.

As an example, a case of a quadrapole electrostatic deflector is shown. However, the deflector is not limited to the quadrapole deflector, and the number of poles can be arbitrarily set. As shown in FIGS. 7 and 8, ways of applying an essential deflection voltage V to deflect the electron beam 200 to a desired position are different between the uniform electric field and the quadrapole lens field. In the respective case, the imaginary correcting voltage $V_{10}$ to correct field curvature and the imaginary correcting voltage $V_{20}$ to correct deflection aberration are added to each other and applied to the electrodes of the deflector 208 to correct deflection aberration.

Figure 9A:
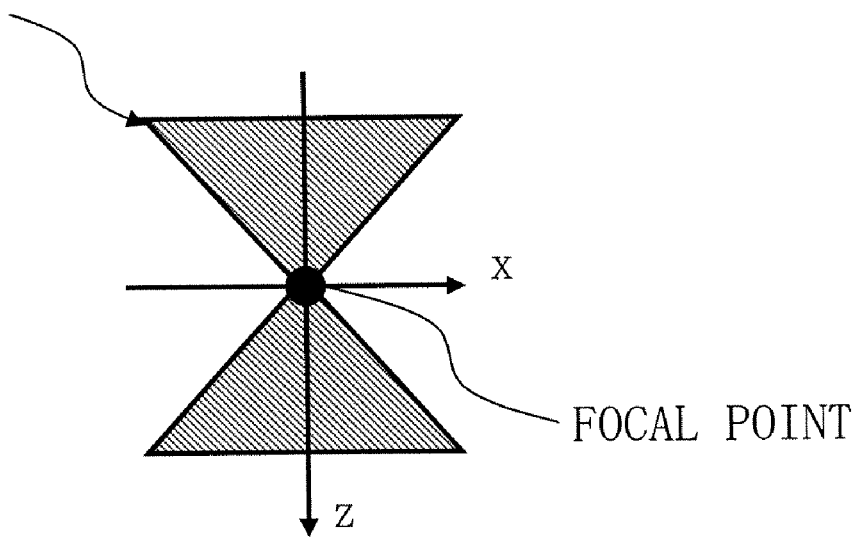
FIGS. 9A and 9B are diagrams showing focal positions at deflection centers.
Figure 9B:
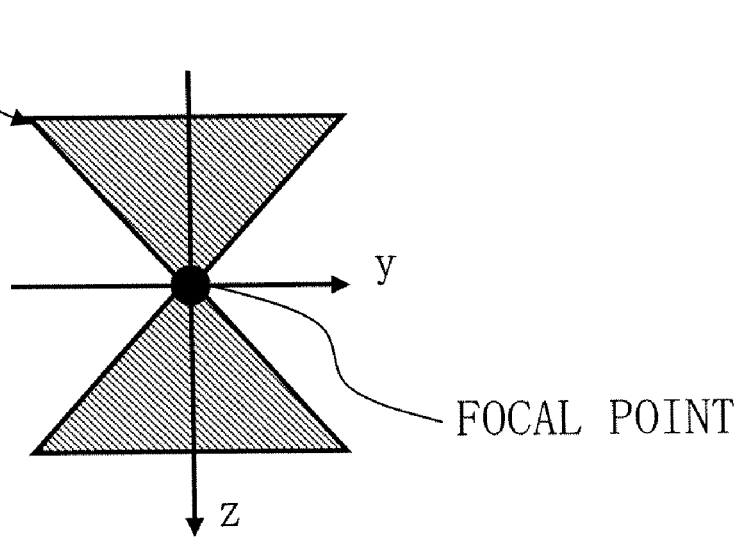

FIGS. 9A and 9b are diagrams showing focal positions at deflection centers.

Figure 10A:
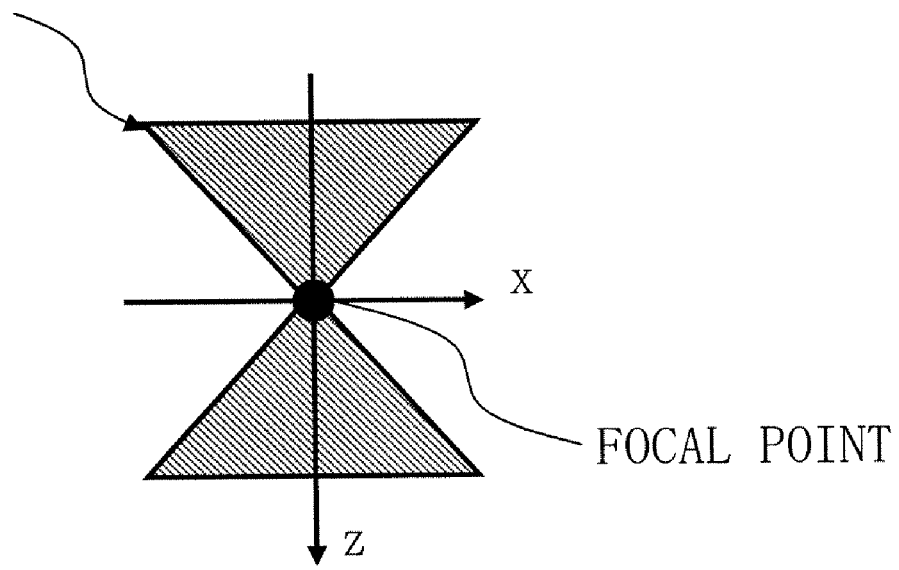
Figure 10A:
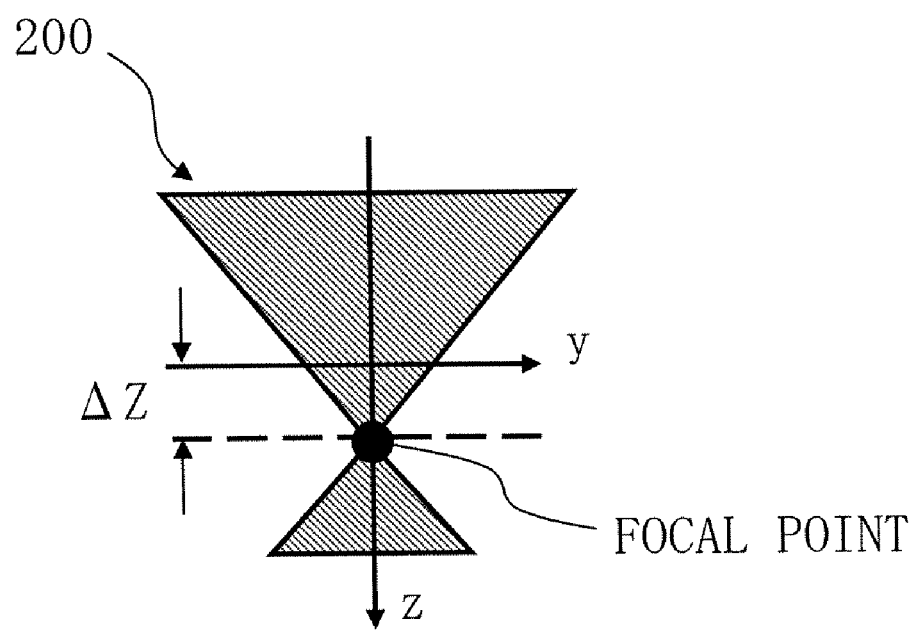

FIGS. 10A and 10B are diagram showing focal positions in deflection states.

When no deflection occurs (deflection center), a focal position (z direction) of the electron beam 200 in the x direction shown in FIG. 9A and a focal position (z direction) of the electron beam 200 in the y direction shown in FIG. 9B are equal to each other. In contrast to this, when deflection occurs, a focal position (z direction) of the electron beam 200 in the x direction shown in FIG. 10A and a focal position (z direction) of the electron beam 200 in the y direction shown in FIG. 10B deviate from each other, and a residual error ($\Delta z$) is generated at the focal positions. A state in which the focal position (z direction) of the electron beam 200 in the x direction is not equal to the focal position (z direction) of the electron beam 200 in the y direction shown in FIG. 10B, i.e., a state in which astigmatism occurs is corrected by a correcting voltage.

Figure 11:
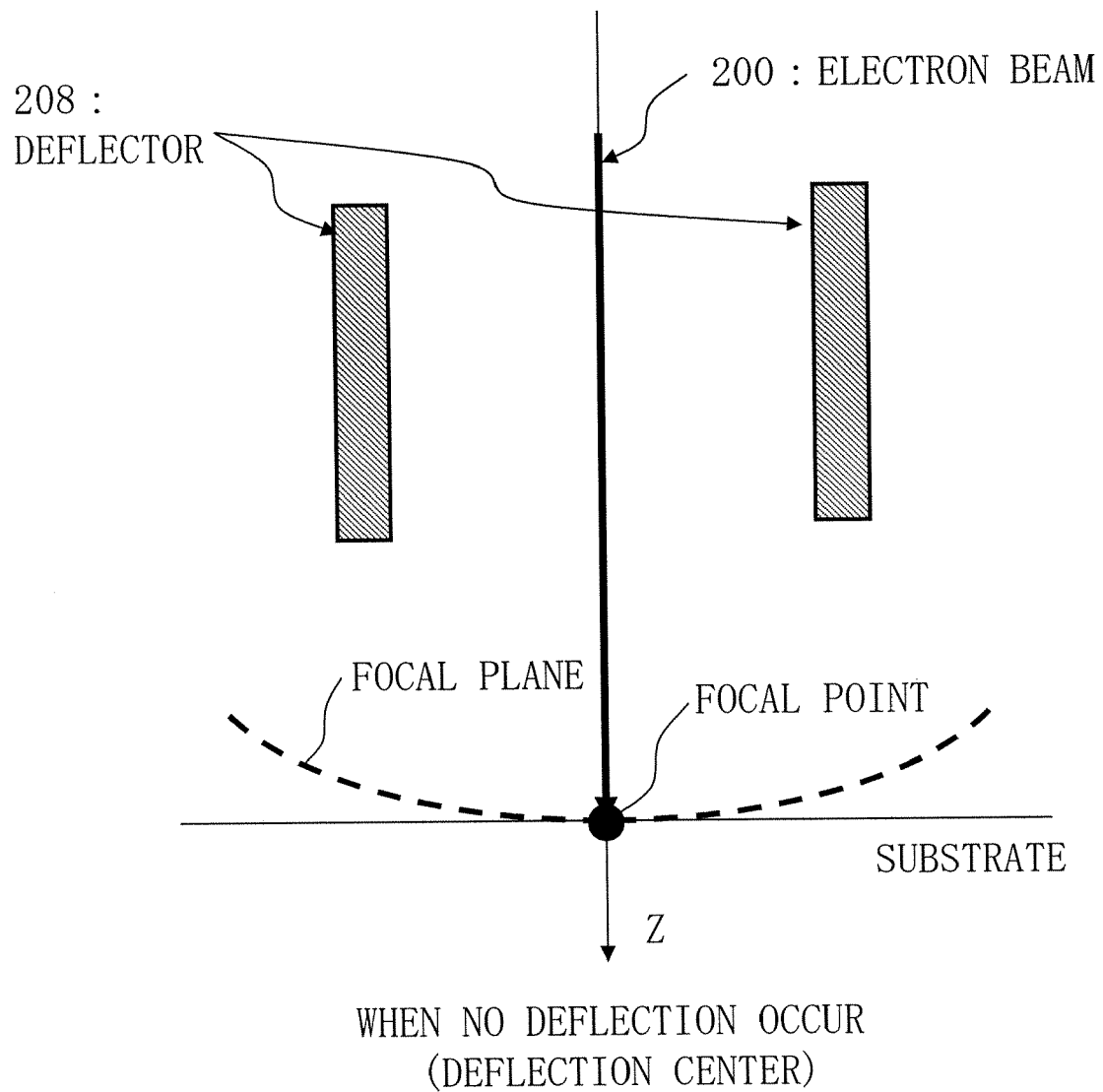
FIG. 11 is a diagram showing a focal position at a deflection center.

FIG. 11 is a diagram showing a focal position at a deflection center.

Figure 12:
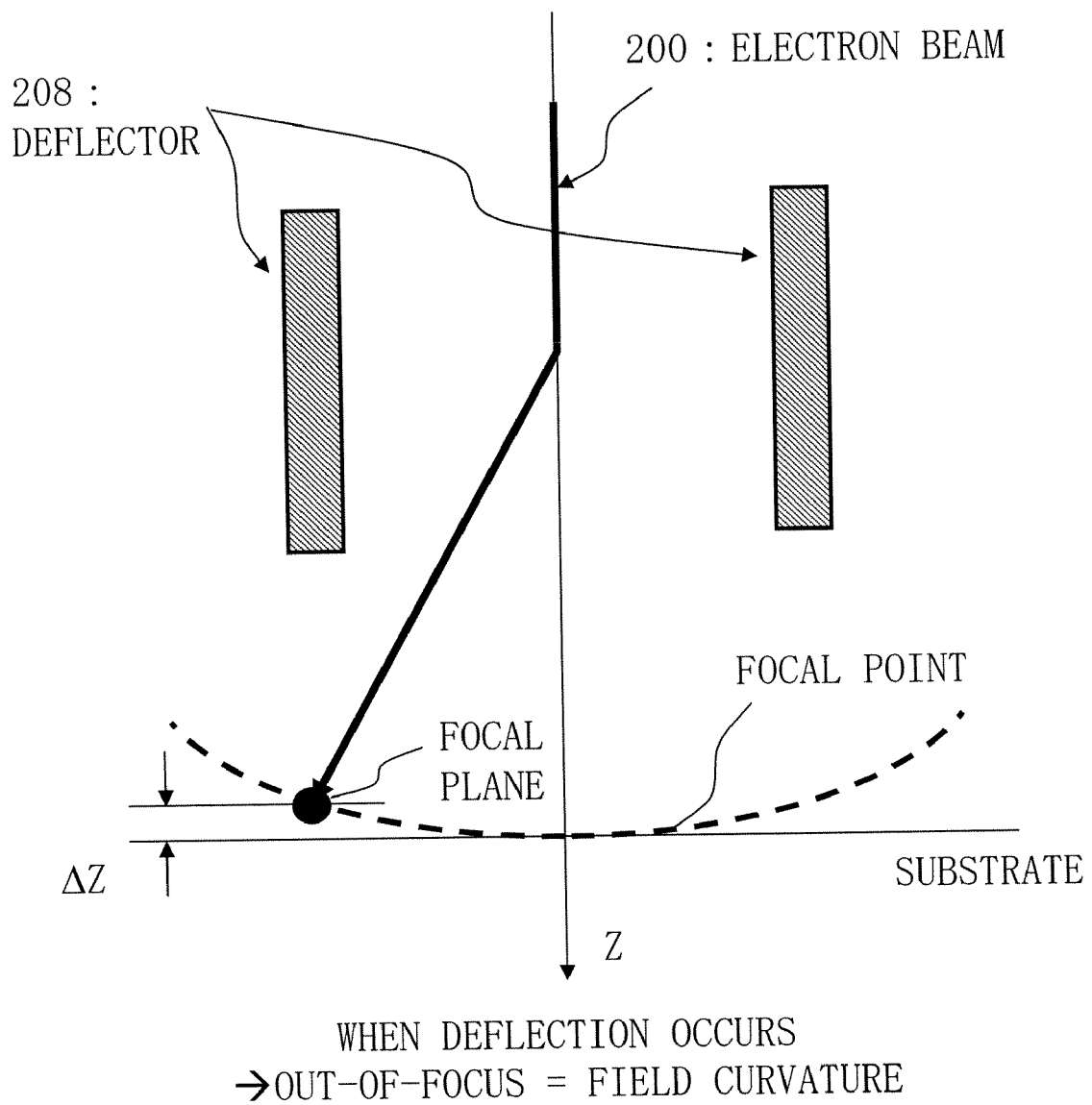
FIG. 12 is a diagram showing a focal position in a deflection state.

FIG. 12 is a diagram showing a focal position in a deflection state.

When no deflection occurs (deflection center), the focal position (z direction) of the electron beam 200 is equal to a height of a substrate surface as shown in FIG. 11. In contrast to this, when deflection is performed by the deflector 208, the focal position (z direction) of the electron beam 200 deviates from the height position of the substrate surface as shown in FIG. 12. The focal position (z direction) is located on a curved focal plane. In this manner, the correction residual error ($\Delta z$) is generated at the focal position. In this manner, a state in which the electron beam 200 is deflected to deviate the focal position (z direction) of the electron beam 200 from the height position of the substrate surface, i.e., a state in which field curvature occurs is corrected by a correcting voltage.

Figure 13:
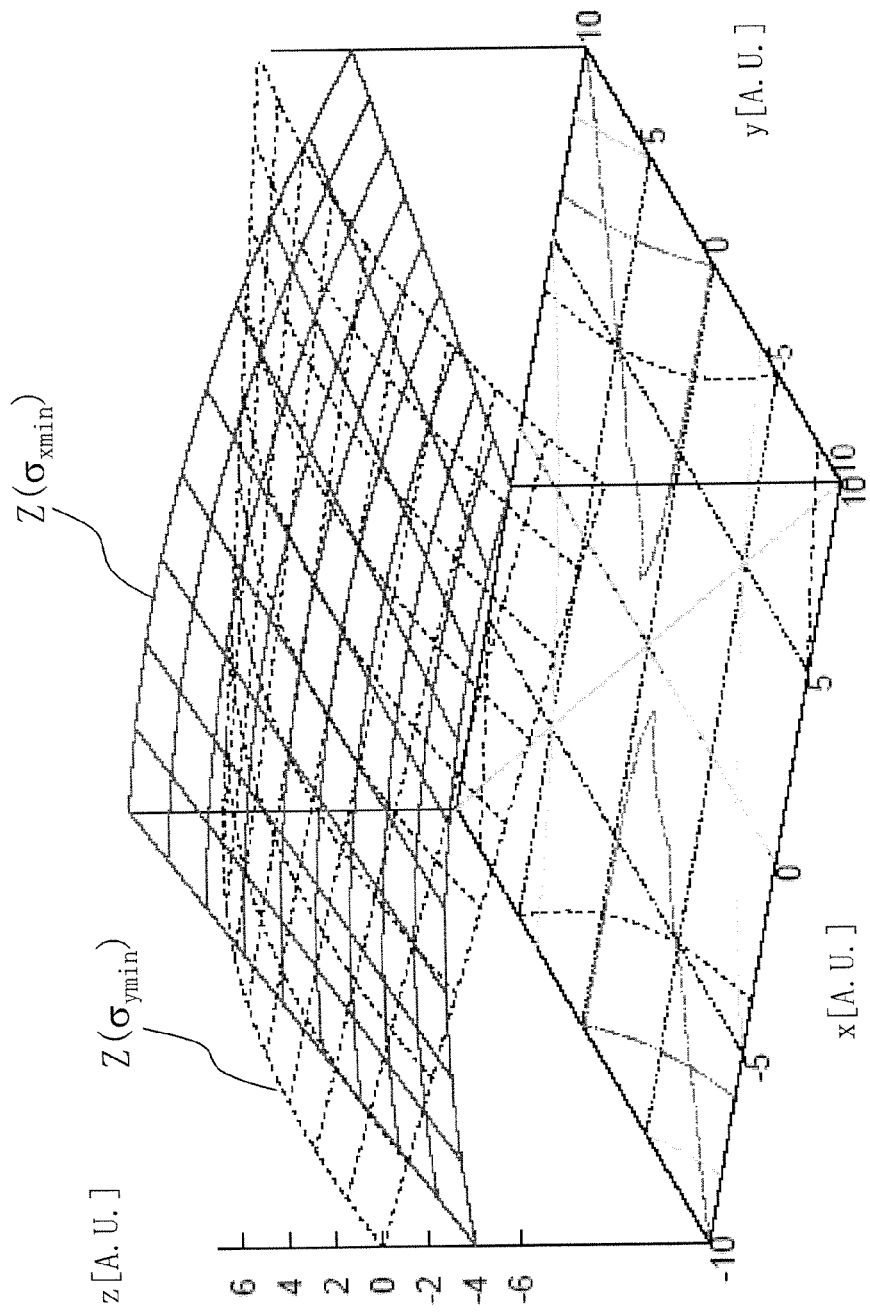
FIG. 13 is a map of a focus height position z ($\sigma_{xmin}$) of a minimum effective resolution $\sigma_{xmin}$ in an x direction and a focus height position z ($\sigma_{ymin}$) of an effective resolution $\sigma_{ymin}$ in a y direction at each coordinate position in the first embodiment.

FIG. 13 is a map of the focus height position z ($\sigma_{xmin}$) of the minimum effective resolution $\sigma_{xmin}$ in the x direction and the focus height position z ($\sigma_{ymin}$) of the effective resolution $\sigma_{ymin}$ in the y direction at each coordinate position in the first embodiment.

Figure 14:
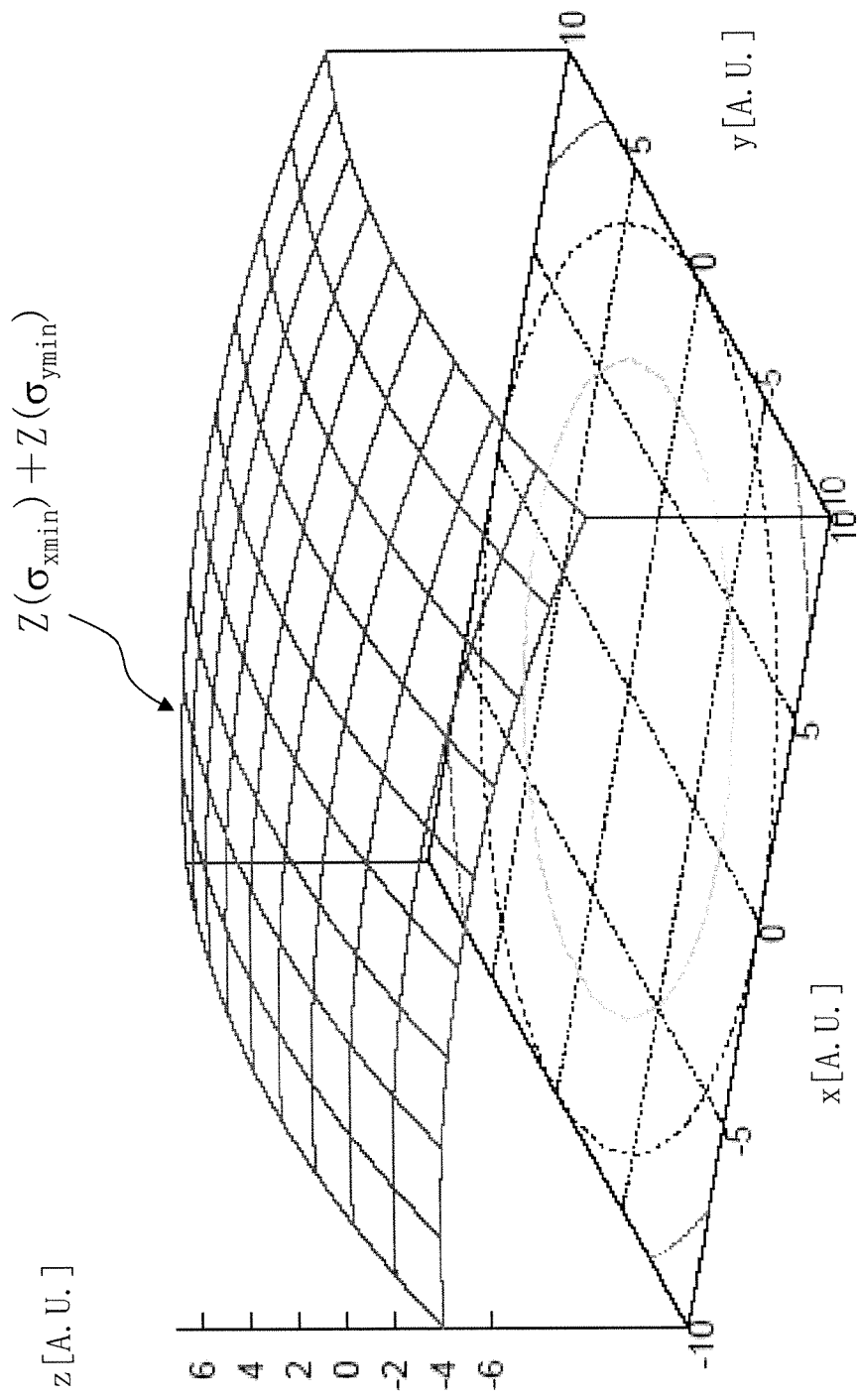
FIG. 14 is a diagram showing a map of a sum of the focus height position z ($\sigma_{xmin}$) and the focus height position z ($\sigma_{ymin}$) at each coordinate position in the first embodiment.

FIG. 14 is a diagram showing a map of a sum of the focus height position z ($\sigma_{xmin}$) and the focus height position z ($\sigma_{ymin}$) at each coordinate position in the first embodiment.

Figure 15:
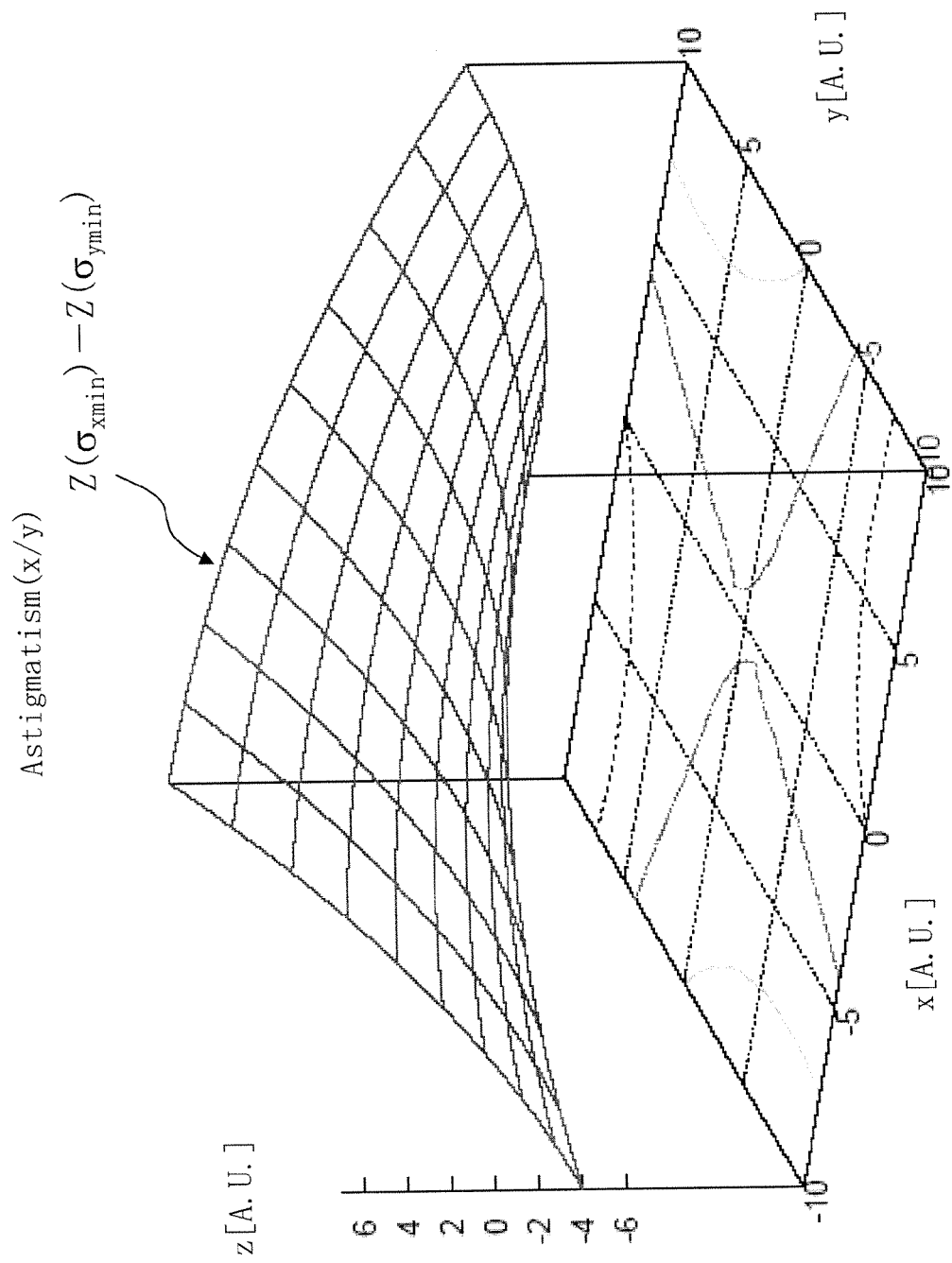
FIG. 15 is a diagram showing a map of a difference between the focus height position z ($\sigma_{xmin}$) and the focus height position z ($\sigma_{ymin}$) at each coordinate position in the first embodiment.

FIG. 15 is a diagram showing a map of a difference between the focus height position z ($\sigma_{xmin}$) and the focus height position z ($\sigma_{ymin}$) at each coordinate position in the first embodiment.

Figure 16:
FIG. 16 is an expression for explaining a method of calculating a correction voltage for correcting field curvature in the first embodiment.

FIG. 16 is an expression for explaining a method of calculating a correction voltage for correcting field curvature in the first embodiment.

A sum of the focus height position z ($\sigma_{xmin}$) and the focus height position z ($\sigma_{ymin}$) is calculated to make it possible to calculate a residual error ($\Delta z$) to correct field curvature. The map shown in FIG. 14 is obtained to make it possible to check a changing state of the residual error ($\Delta z$) to correct field curvature on the basis of the map. Furthermore, the residual error ($\Delta z$) to correct the field curvature at each coordinate position can be checked. According to the map, it can be checked whether or not an optimum correcting voltage is set. When the map is inclined, it can be understood that an optimum correcting voltage to correct the field curvature is not set. When the residual error ($\Delta z$) which is a sum of the focus height position z ($\sigma_{xmin}$) and the focus height position z ($\sigma_{ymin}$) at each coordinate position is made 0 to make it possible to correct the field curvature.

A difference between the focus height position z ($\sigma_{xmin}$) and the focus height position z ($\sigma_{ymin}$) is calculated to make it possible to calculate a residual error ($\Delta z$) to correct astigmatism. The map shown in FIG. 15 is obtained to make it possible to check a changing state of the residual error ($\Delta z$) to correct astigmatism on the basis of the map. Furthermore, the residual error ($\Delta z$) to correct the astigmatism at each coordinate position can be checked. According to the map, it can be checked whether or not an optimum correcting voltage is set. When the map is inclined, it can be understood that an optimum correcting voltage to correct the astigmatism is not set. When the residual error ($\Delta z$) which is a difference between the focus height position z ($\sigma_{xmin}$) and the focus height position z ($\sigma_{ymin}$) at each coordinate position is made 0 to make it possible to correct the astigmatism.

In the first embodiment, furthermore, an optimum correcting voltage $V_\alpha$ to correct the field curvature and an optimum correcting voltage $V_\beta$ to correct the astigmatism are calculated in this state. A relational expression between a sum of the focus height position z ($\sigma_{xmin}$) and the focus height position z ($\sigma_{ymin}$) and the correcting voltage in the first embodiment is given by the following equation (2).

$$\frac{1}{2}\{Z(\sigma_{xmin}) + Z(\sigma_{ymin})\} = k_1 V_1 + c_1 \tag{2}$$

A sum of the focus height position z ($\sigma_{xmin}$) of the minimum effective resolution $\sigma_{xmin}$ in the x direction and the focus height position z ($\sigma_{ymin}$) of the minimum effective resolution $\sigma_{ymin}$ in the y direction is a residual error ($\Delta z$) to correct field curvature. The sum can be expressed by the relational expression given by the above expression (2) by use of a predetermined correcting voltage $V_1$, a coefficient $k_1$, and a constant $C_1$. According to the steps described above, a sum of the focus height position z ($\sigma_{xmin}$) and the focus height position z ($\sigma_{ymin}$) at the imaginary correcting voltage $V_{10}$ can be obtained as the predetermined correcting voltage $V_1$.

A relational expression between a difference between the focus height position z ($\sigma_{xmin}$) and the focus height position z ($\sigma_{ymin}$) and a correction voltage in the first embodiment is shown as the following equation (3).

$$\{Z(\sigma_{xmin})-Z(\sigma_{ymin})\}=k_2 V_2 + c_2 \quad (3)$$

The difference between the focus height position z ($\sigma_{xmin}$) of the minimum effective resolution $\sigma_{xmin}$ in the x direction and the focus height position z ($\sigma_{ymin}$) of the minimum effective resolution $\sigma_{ymin}$ in the y direction is a residual error ($\Delta z$) to correct astigmatism. The difference can be expressed by the relational expression given by the above equation (3) by use of a predetermined correcting voltage $V_2$, a coefficient $k_2$, and a constant $C_2$. According to the steps described above, a difference between the focus height position z ($\sigma_{xmin}$) and the focus height position z ($\sigma_{ymin}$) at the imaginary correcting voltage $V_{20}$ can be obtained as the predetermined correcting voltage $V_2$.

The coefficient $k_1$, the constant $C_1$, the coefficient $k_2$, and the constant $C_2$ are calculated. However, since in this state, only the two relational expressions are obtained, the four values, i.e., the coefficient $k_1$, the constant $C_1$, the coefficient $k_2$, and the constant $C_2$ cannot be calculated. Therefore, the focus height positions z ($\sigma_{xmin}$) of the minimum effective resolutions $\sigma_{xmin}$ in the x direction and the focus height positions z ($\sigma_{ymin}$) of the minimum effective resolutions $\sigma_{ymin}$ in the y direction at the different correcting voltages $V_1$ and $V_2$ are calculated.

In S202, as a parameter setting (2) step, parameters are set in the writing apparatus when the evaluating pattern shown in FIG. 3 is written on the target object 101. In this case, unlike in the parameter setting (1) step, another imaginary correcting voltage $V_{11}$ and another imaginary correcting voltage $V_{21}$ are set in place of the imaginary correcting voltage $V_{10}$ to correct field curvature and the imaginary correcting voltage $V_{20}$ to correct astigmatism aberration. Therefore, in addition to an essential deflection voltage V, $V_{11}+V_{21}$ is added to the deflector 208 as a correcting voltage. Other conditions may be matched with the conditions set in the parameter setting (1) step.

In S204, as a pattern writing step (2), the electron beam 200 is deflected by the deflector 208 by using a second predetermined correcting voltage. At the deflected position, the contact hole patterns shown in FIG. 3 are written at the plurality of focus height positions z. The pattern writing step (2) serves as an example of a second pattern writing step. As the second predetermined correcting voltage, $V_{11}$ and $V_{21}$ are used here. The focus height position, as in the pattern writing step (1), is preferably vibrated in a range of, for example, ±20 μm from a best focus position (z=±0). For example, all the contact hole patterns 10 at the focus positions are written while changing the focus height position every 2.5 μm. In this case, all the contact hole patterns 10 are written in accordance with a focus height position (z=−20 μm) −20 μm distant from the best focus position (z=±0).

In S206, as a $\Delta$CD measuring step (2), a dimensional variation $\Delta$CD of a width size CD of each of the contact hole patterns 10 written at the plurality of focus height positions is measured by using the second predetermined correcting voltage. The $\Delta$CD measuring step (2) serves as an example of a second dimensional variation measuring step. As the second predetermined correcting voltage, the $V_{11}$ and $V_{21}$ are used. The dimensional variation $\Delta$CD serves as an example of a second dimensional variation. The dimensional variation $\Delta$CD, as in the $\Delta$CD measuring step (1), may be calculated by subtracting the measured CD from the reference value $CD_0$ of the pattern width size serving as a reference. The contact hole patterns 10 are used. Therefore, as in the $\Delta$CD measuring step (1), CDs in the x direction and the y direction of all the contact hole patterns 10 are measured with respect to all the contact hole patterns 10.

In S208, as a z changing step, setting of the focus height positions is changed to cause the flow to return to S204. As in S108, for example, a focus height position (z=−17.5 μm) obtained by changing a set focus height position (z=−20 μm) by 2.5 μm is set. The pattern writing step (2) and the $\Delta$CD measuring step (2) are performed. The steps are repeated to vibrate the focus height position from the best focus position (z=±0) in the range of, for example, ±20 μm to measure the $\Delta$CDs in the x direction and the y direction of all the contact hole patterns 10 at the focus height positions z.

In S210, as an effective resolution calculating step (2), effective resolutions $\sigma_{blur}$ of the written contact hole patterns 10 are calculated by using dimensional variations $\Delta$CD in the x direction and the y direction. The effective resolution calculating step (2) serves as an example of a second effective resolution calculating step. The effective resolution $\sigma_{blur}$ calculated here serves as an example a second effective resolution. As in the effective calculating step (1), an effective resolution $\sigma_x$ in the x direction and an effective resolution $\sigma_y$ in the y direction are calculated as the effective resolution $\sigma_{blur}$.

As described above, it is possible to calculate the focus height position z ($\sigma_{xmin}$) of the minimum effective resolution $\sigma_{xmin}$ in the x direction and the focus height position z ($\sigma_{ymin}$) of the minimum effective resolution $\sigma_{ymin}$ in the y direction at the imaginary correcting voltage $V_{11}$ and the imaginary correcting voltage $V_{21}$. This makes it possible to obtain a relational expression shown as equation (2) and a relational expression shown as equation (3) when the imaginary correcting voltage $V_{11}$ and the imaginary correcting voltage $V_{21}$ are set to be the predetermined correcting voltage $V_1$ and the predetermined correcting voltage $V_2$, respectively.

In S302, as a coefficient calculating step, coefficients matched with the relational expression of a correcting voltage to correct deflection aberration are calculated on the basis of the first focus height position at which the first effective resolution is minimum and the second focus height position at which the second effective resolution is minimum. More specifically, the coefficient $k_1$ and the constant $C_1$ of the relational expression shown as equation (2) and the coefficient $k_2$ and the constant $C_2$ of the relational expression shown as equation (3) are calculated. As described above, the focus height positions z ($\sigma_{xmin}$) of the minimum effective resolutions $\sigma_{xmin}$ in the x direction and the focus height positions z ($\sigma_{ymin}$) of the minimum effective resolutions $\sigma_{ymin}$ in the y direction at the imaginary correcting voltage $V_{11}$ and the imaginary correcting voltage $V_{21}$ are calculated. Therefore, the two relational expressions at the imaginary correcting voltage $V_{10}$ and the imaginary correcting voltage $V_{20}$ are united to make it possible to obtain four relational expressions. Accordingly, four values, i.e., the coefficient $k_1$, the constant $C_1$, the coefficient $k_2$, and the constant $C_2$ can be calculated.

In S304, as an optimum correcting voltage calculating step, a correcting voltage to correct deflection aberration when the electron beam 200 is deflected is calculated on the basis of the focus height position z at which the effective resolutions of the contact hole patterns 10 are minimum. Correcting voltages to correct field curvature and astigmatism aberration as deflection aberration are calculated and outputted.

FIG. 16 is an expression for explaining a method of calculating a correction voltage for correcting field curvature in the first embodiment.

As described above, a residual error (Δz), which is a sum (½ of the sum in a relational expression) of the focus height position z ($\sigma_{xmin}$) and the focus height position z ($\sigma_{ymin}$) at each coordinate position, is made 0 to make it possible to correct the field curvature. Therefore, a correcting voltage at which the sum of the focus height position z ($\sigma_{xmin}$) and the focus height position z ($\sigma_{ymin}$) at each coordinate position is 0 may be calculated. The correcting voltage serves as the optimum correcting voltage $V_\alpha$ to correct the field curvature. Therefore, as shown in FIG. 16, the optimum correcting voltage $V_\alpha = -C_1/k_1$ to correct the field curvature can be obtained.

Figure 17:
FIG. 17 is an expression for explaining a method of calculating a correction voltage for correcting astigmatism in the first embodiment.

FIG. 17 is an expression for explaining a method of calculating a correction voltage for correcting astigmatism in the first embodiment.

As described above, a residual error (Δz), which is a difference between the focus height position z ($\sigma_{xmin}$) and the focus height position z ($\sigma_{ymin}$) at each coordinate position, is made 0 to make it possible to correct the astigmatism. Therefore, a correcting voltage may be calculated at which the difference between the focus height position z ($\sigma_{xmin}$) and the focus height position z ($\sigma_{ymin}$) at each coordinate position is 0. The correcting voltage serves as the optimum correcting voltage $V_\alpha$ to correct the astigmatism. Therefore, as shown in FIG. 17, the optimum correcting voltage $V_\beta = -C_2/k_2$ to correct the astigmatism can be obtained.

As described above, the optimum correcting voltage $V_\alpha = -C_1/k_1$ and the optimum correcting voltage $V_\beta = -C_2/k_2$ are calculated to make it possible to obtain an optimum correcting voltage to correct deflection aberration.

In S306, as the pattern writing step, a charged particle beam is deflected to write a desired pattern on a target object by using the correcting voltages. As described above, on the basis of a focus height position at which an effective resolution is minimum, a correcting voltage to correct deflection aberration when the electron beam 200 is deflected is calculated to make it possible to obtain a more appropriate correcting voltage for deflection aberration. By using the correcting voltage, the electron beam 200 is deflected to write a desired pattern on a substrate serving as a target object, so that a pattern having a more high-definition size from which deflection aberration is reduced can be written.

Figure 18:
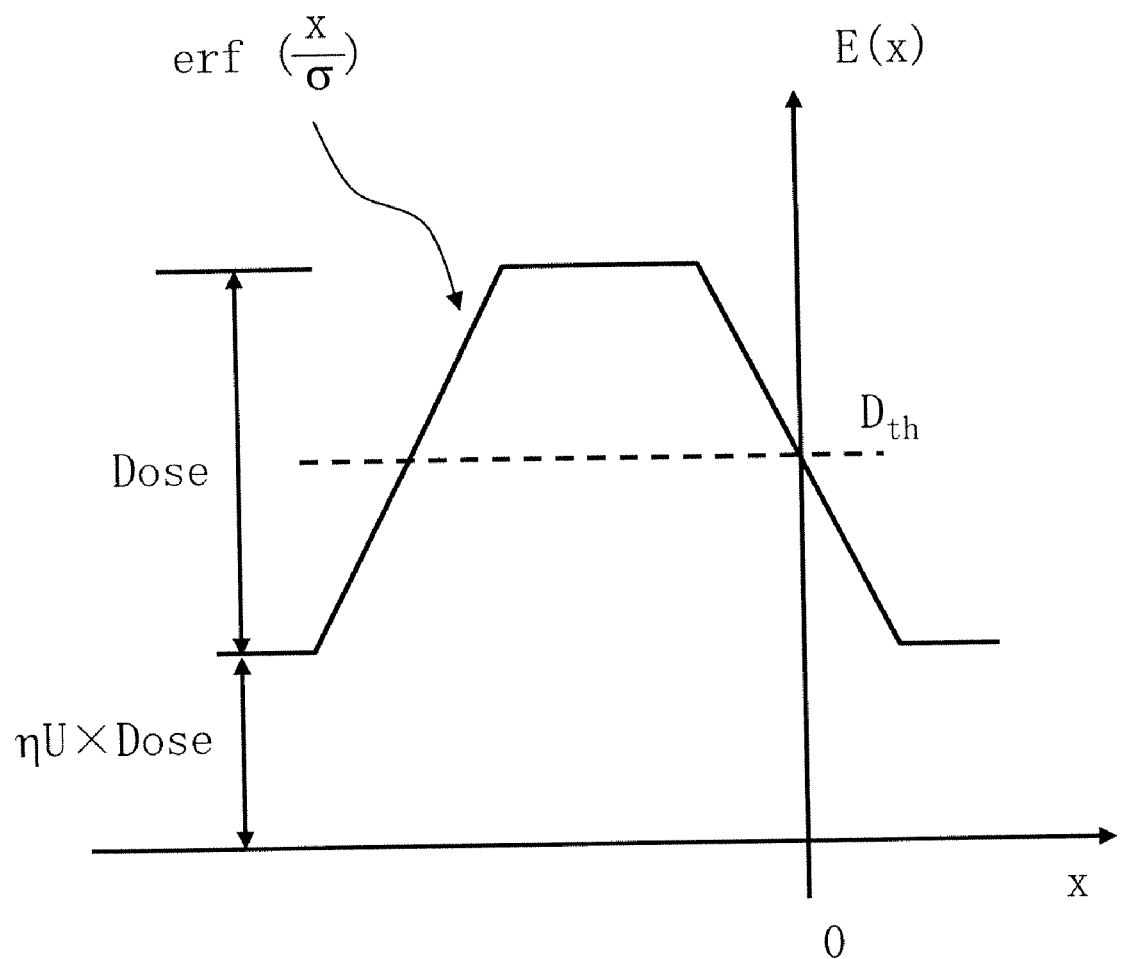
FIG. 18 is a diagram showing an example of a pattern profile in a Threshold model written at an optimum correction voltage in the first embodiment.

FIG. 18 a diagram showing an example of a pattern profile in a Threshold model written at an optimum correction voltage in the first embodiment.

By using the optimum correcting voltages to correct field curvature and the astigmatism, a pattern profile in a Threshold model can be formed as shown in FIG. 18. More specifically, Δx representing a half of ΔCD is not generated. In this case, only the x direction is described for simple explanation. However, a pattern profile can be similarly structured in the y direction.

Figure 19:
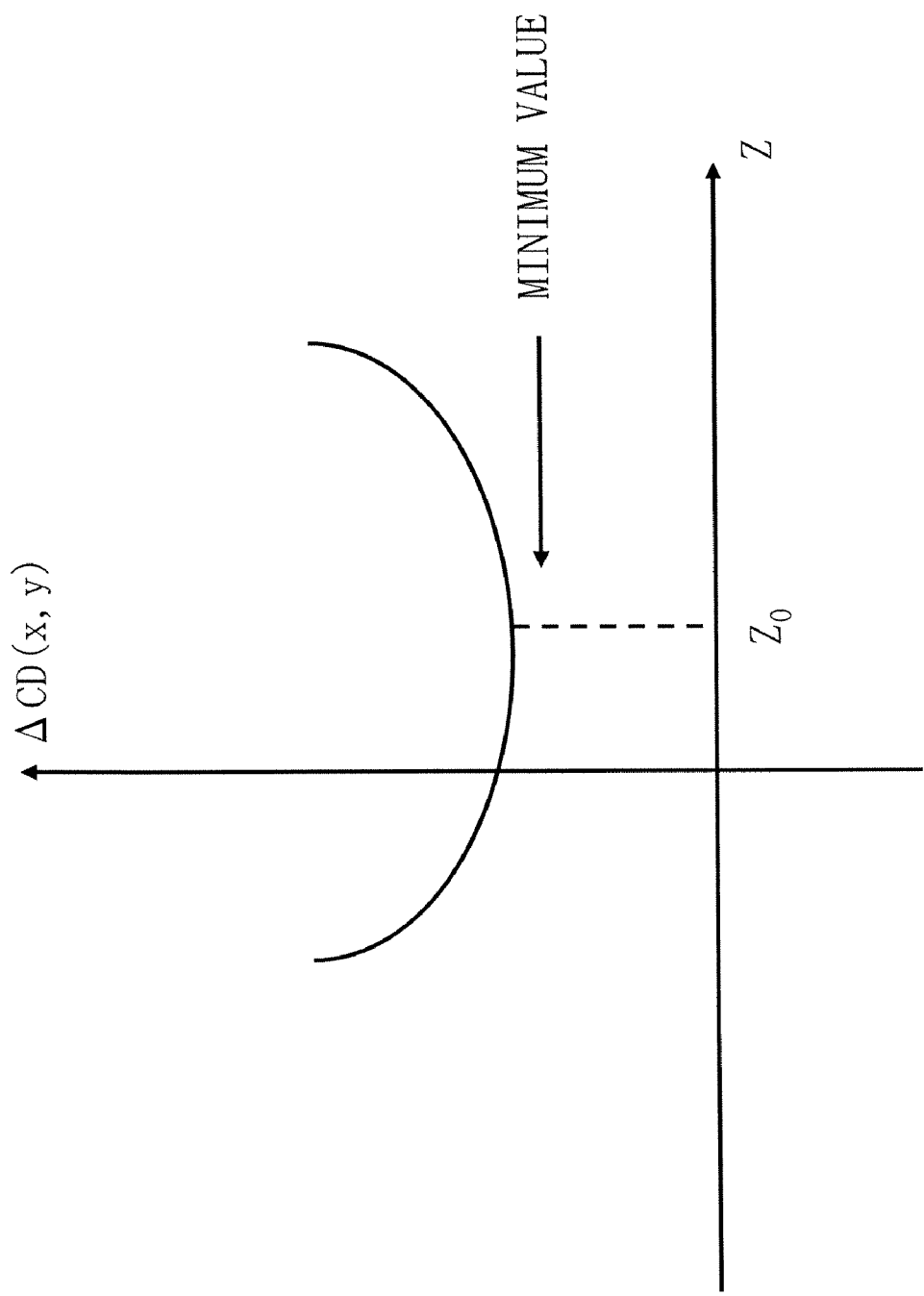
FIG. 19 is a graph showing a relationship between a dimensional variation and a focus height position.

FIG. 19 is a graph showing a relationship between a dimensional variation and a focus height position.

As shown in FIG. 19, when the focus height position z (focal position) is vibrated to write a pattern, the dimensional variation ΔCD (x, y) is minimum since a beam profile is sharp without blurring at the minimum resolution. Therefore, it is also possible to calculate the focus height position z ($\sigma_{xmin}$) of the minimum effective resolution $\sigma_{xmin}$ in the x direction and the focus height position z ($\sigma_{ymin}$) of the minimum effective resolution $\sigma_{ymin}$ in the y direction at positions in the deflection field 20 on the basis of a position at which the dimensional variation ΔCD (x, y) is minimum.

SECOND EMBODIMENT

In the first embodiment, the deflector 208 serving as an objective deflector is explained as a quadrapole electrostatic deflector as shown in FIGS. 8 and 9. However, the deflector is not limited to the quadrapole electrostatic deflector. In a second embodiment, a case using an octa-pole electrostatic deflector will be described as an example.

Figure 20:
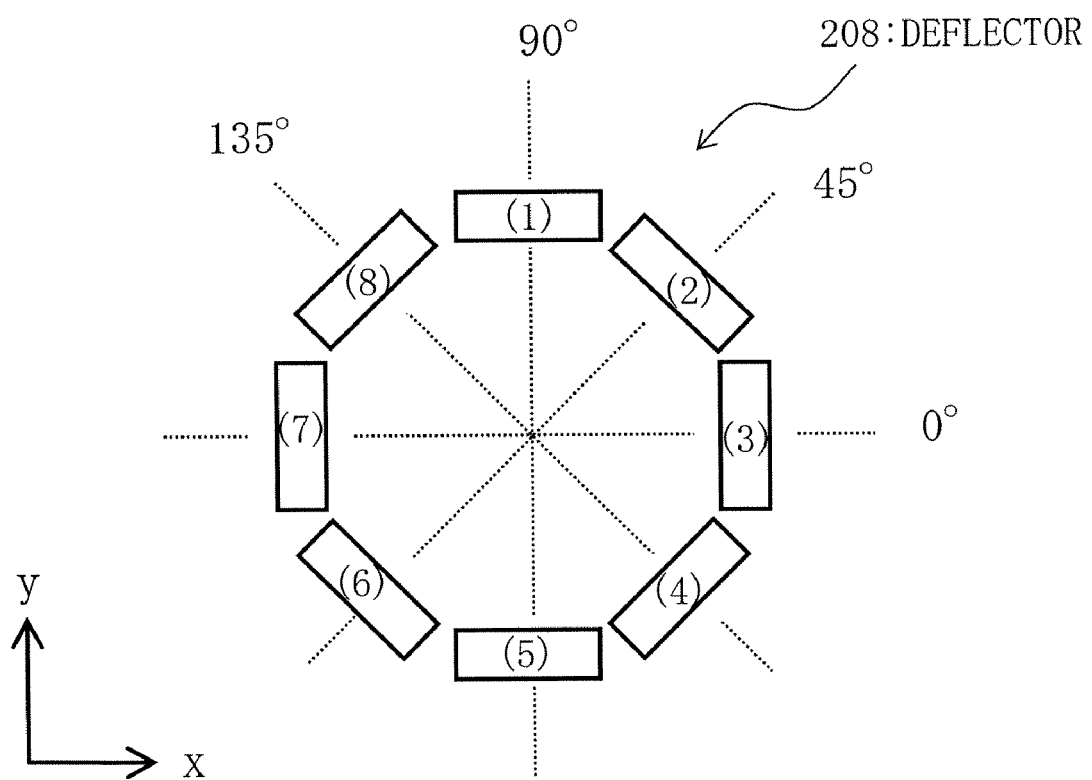
FIG. 20 is a conceptual diagram showing a configuration of a deflector according to a second embodiment.

FIG. 20 is a conceptual diagram showing a configuration of a deflector according to the second embodiment.

In the first embodiment, of electrodes (1) to (8) shown in FIG. 20, electrode (1), electrode (3), electrode (5), and electrode (7) to control directions at angles 0° and 90° are used. More specifically, the direction at an angle of 0° is controlled as the x direction. The direction at an angle of 90° is controlled as the y direction. In the second embodiment, directions at angles of 45° and 135° obtained by rotating the x and y directions by 45° are also controlled. Therefore, in addition to the optimum correcting voltage $V_\alpha$ and the optimum correcting voltage $V_\beta$ calculated in the first embodiment, an optimum correcting voltage $V_\alpha$ to correct field curvature and an optimum correcting voltage $V_\beta$ to correct astigmatism in the directions at 45° and 135° are calculated. In the first embodiment, the optimum correcting voltage $V_\alpha$ and the optimum correcting voltage $V_\beta$ with respect to the directions at 0° and 90° are calculated. When the optimum correcting voltage $V_\alpha$ and the optimum correcting voltage $V_\beta$ are expressed by a correcting voltage $V_{\alpha(0°, 90°)}$ and a correcting voltage $V_{\beta(0°, 90°)}$, respectively, a correcting voltage $V_{\alpha(45°, 135°)}$ and a correcting voltage $V_{\beta(45°, 135°)}$ in the directions at 45° and 135° are calculated. A method of calculating the correcting voltage $V_{\alpha(45°, 135°)}$ and the correcting voltage $V_{\beta(45°, 135°)}$ is the same as that in the contents described in the first embodiment. However, the x direction may be regarded as the direction at 45°, and the y direction may be regarded as the direction at 135°. In place of the evaluating pattern in the first embodiment shown in FIG. 3, the following evaluating pattern is used.

Figure 21:
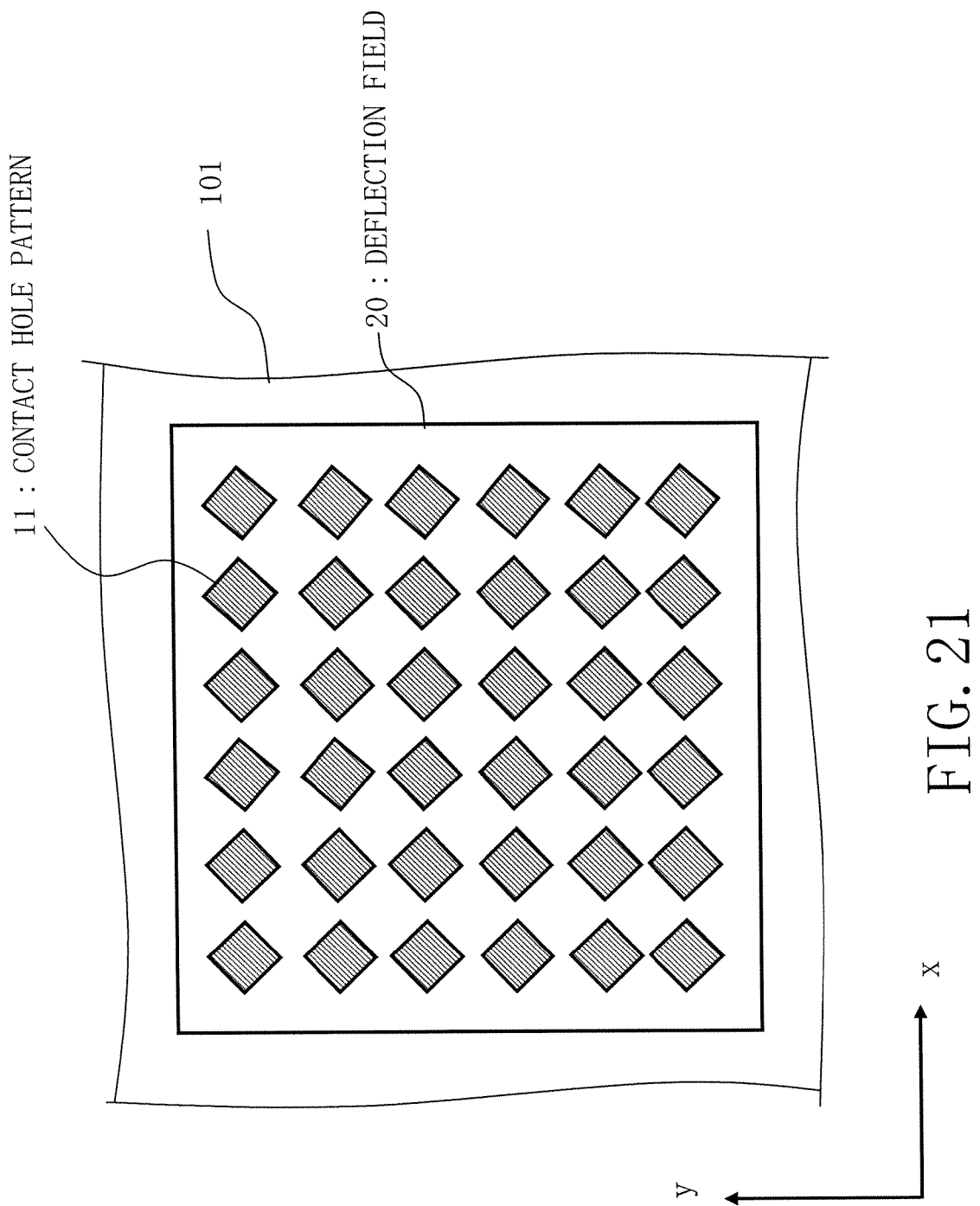
FIG. 21 is a diagram showing an example of an evaluating pattern in the second embodiment.

FIG. 21 is a diagram showing an example of an evaluating pattern in the second embodiment.

The evaluating pattern (second pattern) in FIG. 21 is the same as the pattern obtained by rotating each of the contact hole patterns 10 shown in FIG. 3 by 45°. In this manner, a contact hole pattern 11 (example of a predetermined pattern) serving as a pattern having widths in the directions at 45° and 135° is formed. By using the contact hole pattern 11, pattern width sizes (CD) in the directions at 45° and 135° can be measured.

The calculated optimum correcting voltage $V_{\alpha(45°, 135°)}$ to correct field curvature and the optimum correcting voltage $V_{\beta(45°, 135°)}$ to correct astigmatism in the directions at 45° and 135° are used to write a pattern on a target object 101.

Figure 22:
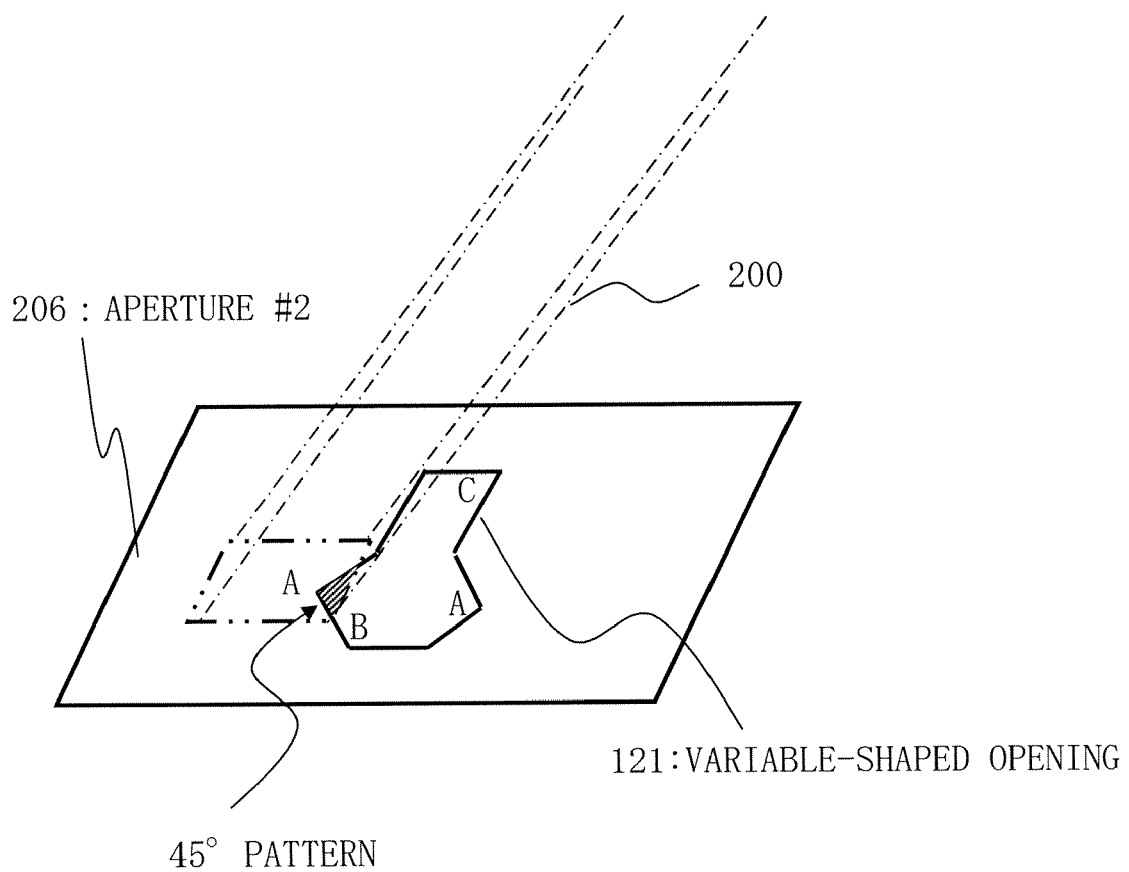
FIG. 22 is a diagram showing an example of a shaping aperture.
Figure 23:
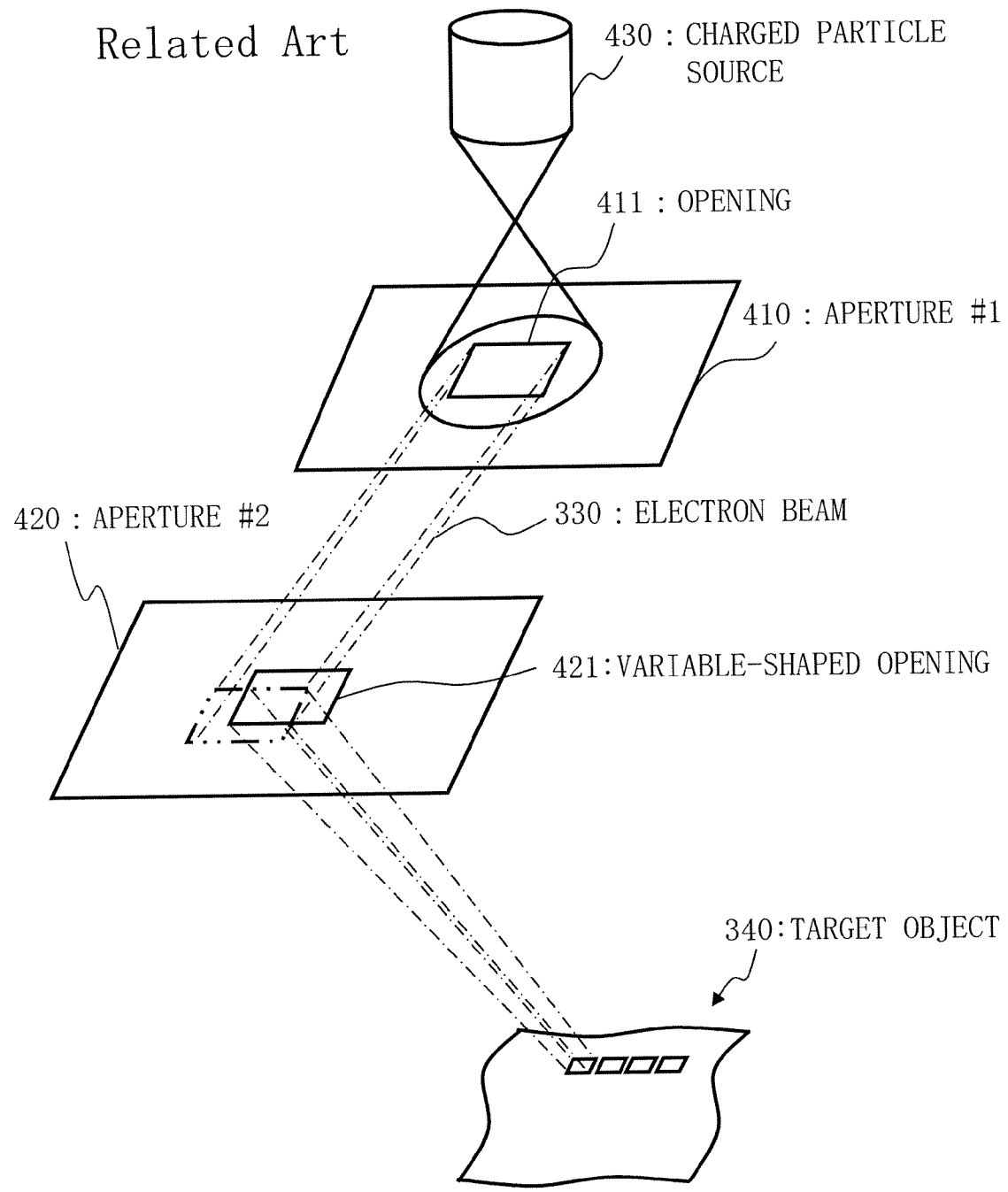
FIG. 23 is a conceptual diagram for explaining an operation of a conventional variable-shaped electron beam photolithography apparatus.

FIG. 22 is a diagram showing an example of a shaping aperture.

A variable-shaped opening 121 is formed in a second aperture 206 shown in FIG. 22. In the variable-shaped opening 121, an angle of a corner indicated by "A" is set at 45°. An angle of a corner indicated by "B" is set at 135°. An angle of a corner indicated by "C" is set at 90°. Therefore, depending on a position on which an image of the electron beam 200 having passed through a first aperture 203 having a rectangular opening is irradiated, the beam can be variably shaped in beam shapes having not only 90° but also 45° and 135°. Consequently, the variable-shaped image is deflected by the deflector 208 to make it possible to write patterns having angles of not only 90° but also 45° and 135° at a desired position of the target object 101. In the second embodiment, since a deflection voltage of the deflector 208 can be corrected by the optimum correcting voltage $V_{\alpha(45°, 135°)}$ and the optimum correcting voltage $V_{\beta(45°, 135°)}$ in the directions at 45° and 135°, field curvature and astigmatism can also be corrected in the directions.

As described above, the beam can be variably shaped in the beam shapes having angles of 45° and 135°. Thus, when a pattern having an angle of 45° is written, the pattern can be written by a step-less straight line. Accordingly, a highly accurate pattern can be formed.

The embodiments are explained with reference to the concrete examples. However, the present invention is not limited to the concrete examples.

Parts such as an apparatus configuration or a control method which are not directly required to explain the present invention are omitted. However, a necessary apparatus configuration and a necessary control method can be appropriately selected and used. For example, although a control unit configuration for controlling the writing apparatus 100 is omitted, a necessary control unit configuration is appropriately selected and used, as a matter of course.

All methods of calculating a deflection aberration correcting voltage, charged particle beam writing methods, and charged particle beam writing apparatuses which include the elements of the present invention and which can be appropriately changed in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of obtaining a deflection aberration correcting voltage, comprising:
   writing predetermined patterns at a plurality of focus height positions such that a dose is used as a variable for each of the plurality of focus height positions;
   measuring dimensional variations of width sizes of the predetermined patterns written at the plurality of focus height positions such that the dose is used as the variable for each of the plurality of focus height positions;
   calculating effective resolutions of the written predetermined patterns by using the dimensional variations; and
   on the basis of a focus height position at which a minimum effective resolution of the predetermined patterns is obtained, calculating a correcting voltage to correct deflection aberration and outputting the correcting voltage, wherein the correcting voltage is used when a charged particle beam is deflected.

2. The method according to claim 1, wherein
   patterns having widths in an x direction and a y direction are used as the predetermined patterns.

3. The method according to claim 2, wherein
   directions at 0° and 90° are used as the x direction and the y direction.

4. The method according to claim 2, wherein
   directions at 45° and 135° are used as the x direction and the y direction.

5. The method according to claim 2, wherein
   in calculation of the effective resolutions, the effective resolutions in the x direction and the y direction are calculated.

6. The method according to claim 5, wherein
   effective resolutions in directions at 0° and 90° are calculated.

7. The method according to claim 5, wherein
   effective resolutions in directions at 45° and 135° are calculated.

8. The method according to claim 5, wherein
   in calculation of the correcting voltage, correcting voltages to correct field curvature and astigmatism aberration as the deflection aberration are calculated.

9. The method according to claim 1, wherein
   as the predetermined patterns, a first pattern having widths in the directions at 0° and 90° and a second pattern having widths in directions at 45° and 135° are used.

10. The method according to claim 9, wherein
    in calculation of the effective resolutions, effective resolutions in the directions at 0° and 90° and effective resolutions in the directions at 45° and 135° are calculated.

11. The method according to claim 10, wherein in calculation of the correcting voltage, correcting voltages to correct field curvature and astigmatism aberration in the directions at 0° and 90° as the deflection aberration and correcting voltages to correct field curvature and astigmatism aberration in the directions at 45° and 135° as the deflection aberration are calculated.

12. The method according to claim 1, further comprising:
    acquiring an iso focal dose by using a plurality of focus height positions and a plurality of doses;
    wherein the predetermined patterns write at a exposure dose of the charged particle beam instead of the iso focal dose.

13. A charged particle beam writing method comprising:
    writing predetermined patterns at a plurality of focus height positions such that a dose is used as a variable for each of the plurality of focus height positions;
    on the basis of a focus height position at which a minimum effective resolution of the predetermined patterns written at the plurality of focus height positions such that the dose is used as the variable for each of the plurality of focus height positions is obtained, calculating a correcting voltage to correct deflection aberration when a charged particle beam is deflected; and
    by using the correcting voltage, deflecting the charged particle beam to write a desired pattern on a target object.

14. The charged particle beam writing method according to claim 13, wherein
    in calculation of the correcting voltage, correcting voltages to correct deflection aberration in directions at 45° and 135° are calculated, and the charged particle beam variably shaped in a beam shape having an angle of 45° by an aperture is deflected.

* * * * *